US012324237B2

(12) United States Patent
Xie et al.

(10) Patent No.: US 12,324,237 B2
(45) Date of Patent: Jun. 3, 2025

(54) DIFFUSION-BREAK REGION IN STACKED-FET INTEGRATED CIRCUIT DEVICE

(71) Applicant: INTERNATIONAL BUSINESS MACHINES CORPORATION, Armonk, NY (US)

(72) Inventors: Ruilong Xie, Niskayuna, NY (US); Alexander Reznicek, Troy, NY (US); Daniel Schmidt, Niskayuna, NY (US); Tsung-Sheng Kang, Ballston Lake, NY (US)

(73) Assignee: International Business Machines Corporation, Armonk, NY (US)

( * ) Notice: Subject to any disclaimer, the term of this patent is extended or adjusted under 35 U.S.C. 154(b) by 464 days.

(21) Appl. No.: 17/981,590

(22) Filed: Nov. 7, 2022

(65) Prior Publication Data

US 2024/0153951 A1 May 9, 2024

(51) Int. Cl.
| | |
|---|---|
| *H01L 27/092* | (2006.01) |
| *H01L 21/02* | (2006.01) |
| *H01L 21/822* | (2006.01) |
| *H01L 21/8238* | (2006.01) |
| *H01L 29/06* | (2006.01) |
| *H01L 29/417* | (2006.01) |
| *H01L 29/423* | (2006.01) |
| *H01L 29/775* | (2006.01) |
| *H10D 30/01* | (2025.01) |
| *H10D 30/43* | (2025.01) |

(Continued)

(52) U.S. Cl.
CPC ..... *H10D 84/856* (2025.01); *H01L 21/02603* (2013.01); *H10D 30/014* (2025.01); *H10D 30/031* (2025.01); *H10D 30/43* (2025.01); *H10D 30/6729* (2025.01); *H10D 30/6735* (2025.01); *H10D 62/121* (2025.01); *H10D 64/017* (2025.01); *H10D 84/0167* (2025.01); *H10D 84/0186* (2025.01); *H10D 84/038* (2025.01); *H10D 88/01* (2025.01)

(58) Field of Classification Search
CPC .. H10D 84/856; H10D 30/014; H10D 30/031; H10D 30/43; H10D 30/6729; H10D 30/6735; H10D 62/121; H10D 64/017; H10D 84/0167; H10D 84/0186; H10D 84/038; H10D 88/01; H10D 30/6757; H10D 84/83; H10D 88/00; H10D 84/0149; H10D 84/0151; H01L 21/02603
See application file for complete search history.

(56) References Cited

U.S. PATENT DOCUMENTS

| | | |
|---|---|---|
| 7,687,834 B2 | 3/2010 | Kapoor |
| 7,855,403 B2 | 12/2010 | Bertin et al. |

(Continued)

*Primary Examiner* — Tong-Ho Kim
(74) *Attorney, Agent, or Firm* — Daniel M. Yeates

(57) ABSTRACT

A stacked field effect transistor (stacked-FET) device includes a first layer comprising at least one first layer transistor structure comprising a plurality of first layer terminals, a diffusion break dielectric fill region adjacent to one of the first layer terminals, a second layer overlying and adjacent to the first layer and comprising at least one second layer transistor structure comprising a plurality of second layer terminals, and a contact wiring between the first layer and the second layer passing through the diffusion break dielectric fill region of the first layer and connecting with one of the second layer terminals.

20 Claims, 23 Drawing Sheets

(51) Int. Cl.
*H10D 30/67* (2025.01)
*H10D 62/10* (2025.01)
*H10D 64/01* (2025.01)
*H10D 84/01* (2025.01)
*H10D 84/03* (2025.01)
*H10D 84/85* (2025.01)
*H10D 88/00* (2025.01)

(56) References Cited

U.S. PATENT DOCUMENTS

| | | |
|---|---|---|
| 7,855,455 B2 | 12/2010 | Purushothaman et al. |
| 8,093,099 B2 | 1/2012 | Purushothaman et al. |
| 8,124,525 B1 | 2/2012 | Koburger, III et al. |
| 9,064,717 B2 | 6/2015 | Purushothaman et al. |
| 9,659,963 B2 | 5/2017 | Cheng et al. |
| 9,831,306 B2 | 11/2017 | Webb et al. |
| 9,837,414 B1 | 12/2017 | Balakrishnan et al. |
| 10,192,867 B1 | 1/2019 | Frougier et al. |
| 10,256,158 B1 | 4/2019 | Frougier et al. |
| 10,388,519 B2 | 8/2019 | Smith et al. |
| 10,522,410 B2 | 12/2019 | Economikos et al. |
| 11,056,487 B2 | 7/2021 | Yang |
| 2002/0036347 A1 | 3/2002 | Houston |
| 2019/0058036 A1* | 2/2019 | Smith ............... H01L 21/32133 |
| 2020/0075574 A1 | 3/2020 | Smith et al. |
| 2020/0373330 A1 | 11/2020 | Liebmann et al. |

\* cited by examiner

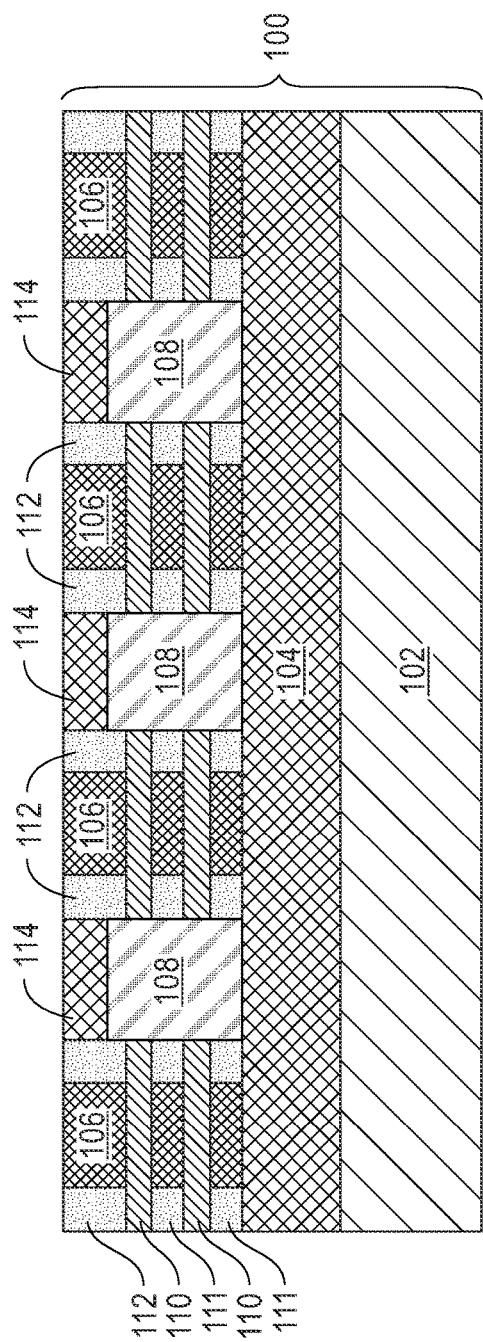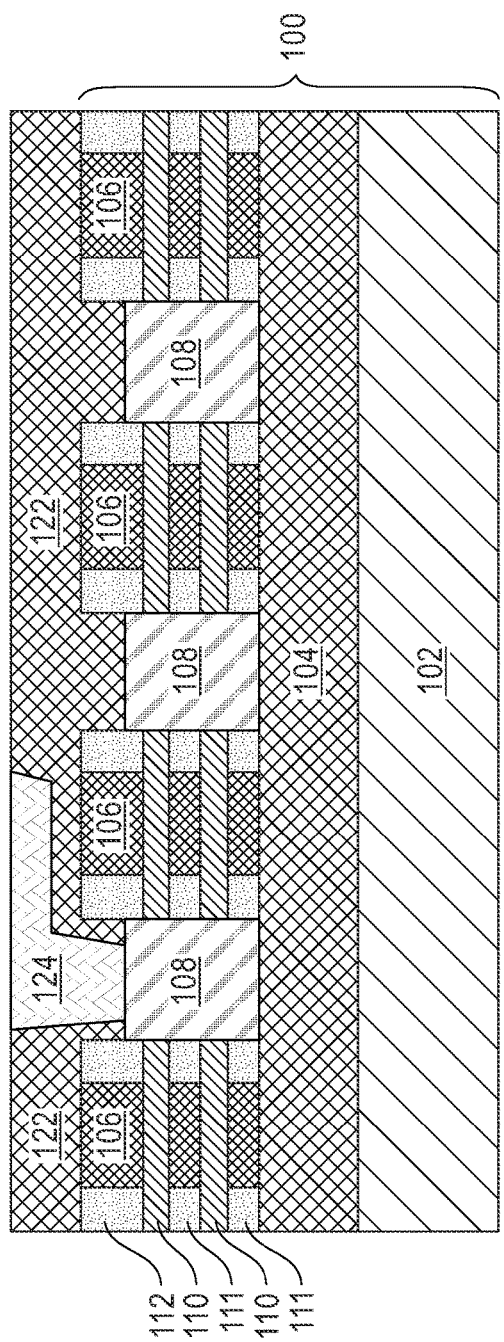

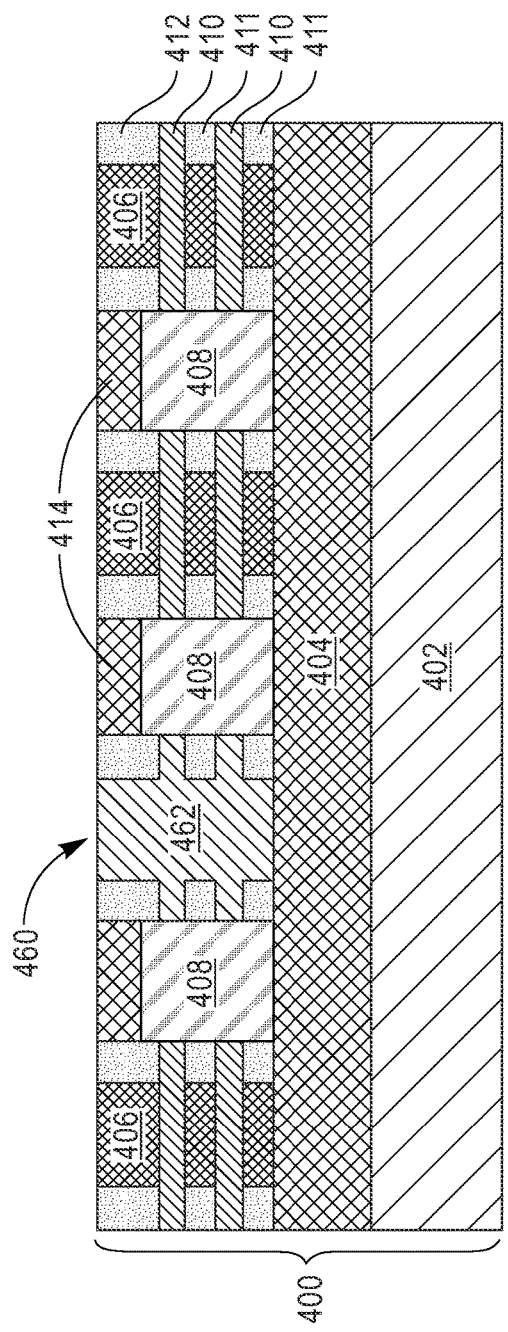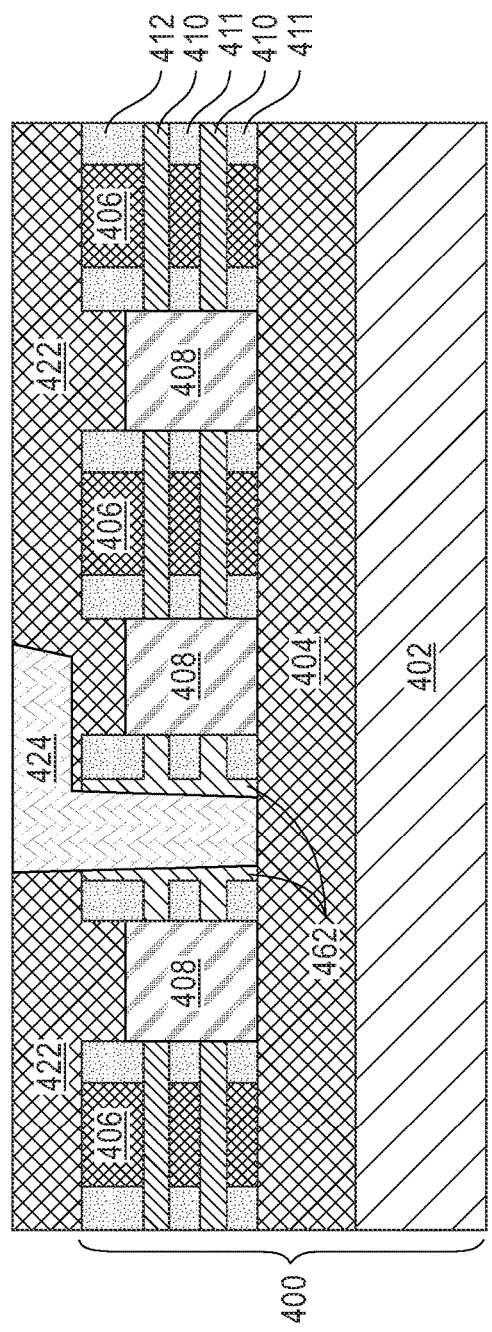

DIFFUSION-BREAK REGION IN STACKED-FET INTEGRATED CIRCUIT DEVICE

BACKGROUND

The present disclosure is generally in the field of integrated circuit (IC) devices and methods for fabricating integrated circuit devices. More particularly, the present disclosure relates to stacked field effect transistor (stacked-FET) integrated circuit devices.

Integrated circuit chips are formed on semiconductor wafers at increasingly smaller scale. In current technology nodes, such as 5, 7, 10 and 14 nanometer technologies, transistor devices are constructed as three-dimensional (3D) fin field effect transistor (FINFET) structures. However, chipmakers face myriad challenges at 3 nm and beyond. Currently, traditional chip scaling continues to slow as process complexities and costs escalate at each node.

The use of non-planar semiconductor devices such as, for example, semiconductor nanosheet field effect transistors is the next step in the evolution of complementary metal oxide semiconductor (CMOS) devices. Semiconductor nanosheet FETs can achieve higher drive currents with increasingly smaller dimensions as compared to conventional planar FETs.

Three-dimensional (3D) monolithic integration by stacking one type of FETs (e.g., p-type FETs) on top of a complementary type of FETs (e.g., n-type FETs) is an attractive approach for 2 nm node technology and beyond. FET stacking combined with nanosheet technology can benefit from device electrostatics control in addition to area scaling.

SUMMARY

Some embodiments of the present disclosure can be illustrated as a stacked field effect transistor device. The stacked field effect transistor device includes a first layer comprising at least one first layer transistor structure comprising a plurality of first layer terminals. The stacked field effect transistor device also includes a diffusion break dielectric fill region adjacent to one of the first layer terminals. The stacked field effect transistor device also includes a second layer overlying and adjacent to the first layer and comprising at least one second layer transistor structure that comprises a plurality of second layer terminals. The stacked field effect transistor device also includes a contact wiring between the first layer and the second layer passing through the diffusion break dielectric fill region of the first layer and connecting with one of the second layer terminals.

Some embodiments of the present disclosure can also be illustrated as a stacked field effect transistor device. The stacked field effect transistor device includes a first layer comprising at least one first layer transistor structure comprising a plurality of first layer terminals. The stacked field effect transistor device also includes a second layer overlying and adjacent to the first layer and comprising at least one second layer transistor structure comprising a plurality of second layer terminals. The stacked field effect transistor device also includes a diffusion break dielectric fill region adjacent to one of the second layer terminals. The stacked field effect transistor device also includes a contact wiring between the first layer and the second layer passing through the diffusion break dielectric fill region of the second layer and passing through one of the first layer terminals.

Some embodiments of the present disclosure can also be illustrated as a stacked field effect transistor device. The stacked field effect transistor device includes a first layer comprising at least one first layer transistor structure comprising a plurality of first layer terminals. The stacked field effect transistor device also includes a diffusion break dielectric fill region adjacent to one of the first layer terminals. The stacked field effect transistor device also includes a second layer overlying and adjacent to the first layer and comprising at least one second layer transistor structure comprising a plurality of second layer terminals. The stacked field effect transistor device also includes a contact wiring between the first layer and the second layer passing through the diffusion break dielectric fill region of the first layer and connecting with one of the second layer terminals. The stacked field effect transistor device also includes an additional first layer drain region. The diffusion break dielectric fill region is adjacent to the first layer source region and is adjacent to the additional first layer drain region.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

Exemplary embodiments of the present disclosure will hereinafter be described in conjunction with the following drawing figures, wherein like numerals denote like elements, and wherein:

FIGS. 2-17 provide cross-sectional views illustrating procedures in the fabrication of a stacked-FET IC device in accordance with a first embodiment of the present disclosure;

FIGS. 23-26 provide cross-sectional views illustrating procedures in the fabrication of a stacked-FET IC device in accordance with a fourth embodiment of the present disclosure.

DETAILED DESCRIPTION

Figure 1:
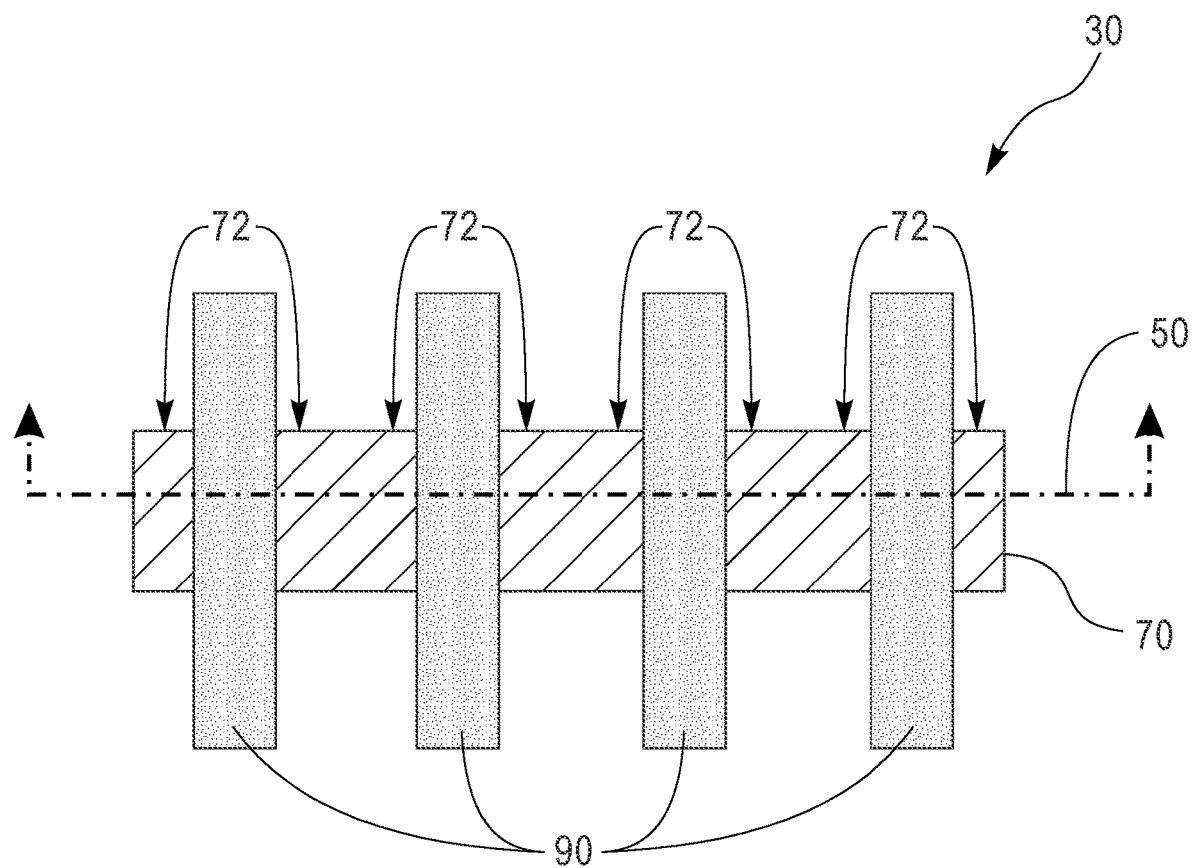
FIG. 1 is an overhead illustration of a stacked FET integrated circuit device in accordance with embodiments of the present disclosure, showing a cross-sectional plane through which the following figures are presented.

The disclosure will now be described in greater detail by referring to the following discussion and drawings that accompany the present disclosure. It is noted that the drawings of the present disclosure are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present disclosure may be practiced without these specific details. In other instances, well-known structures or processing steps in the fabrication of integrated circuit structures have not been described in detail in order to avoid obscuring the present disclosure.

Exemplary applications/uses to which the present disclosure can be applied include, but are not limited to: transistors for complementary metal-oxide-semiconductor (CMOS) devices, logic devices (e.g., NAND gates, NOR gates, XOR gates, etc.), memory devices (e.g., DRAM, SRAM, flip-flops, etc.), etc.

In various embodiments, the materials and layers can be deposited by physical vapor deposition (PVD), chemical vapor deposition (CVD), atomic layer deposition (ALD), molecular beam epitaxy (MBE), or any of the various modifications thereof, for example, plasma-enhanced chemical vapor deposition (PECVD), metal-organic chemical vapor deposition (MOCVD), low pressure chemical vapor deposition (LPCVD), electron-beam physical vapor deposition (EB-PVD), and plasma-enhanced atomic layer deposition (PEALD). The depositions can be epitaxial processes, and the deposited material can be crystalline. In various embodiments, formation of a layer may be by one or more deposition processes, where, for example, a conformal layer can be formed by a first process (e.g., ALD, PEALD, etc.) and a fill can be formed by a second process (e.g., CVD, electrodeposition, PVD, etc.).

It is to be understood that the present invention will be described in terms of a given illustrative architecture; however, other architectures, structures, substrate materials and process features and steps may be varied within the scope of the present disclosure. It should be noted that certain features may not be shown in all figures for the sake of clarity. This is not intended to be interpreted as a limitation of any particular embodiment, or illustration, or scope of the claims.

Reference to source/drain projections, layers, regions, etc., is intended to indicate that the particular device feature can be implemented as a source or a drain except as expressly indicated otherwise. In addition, the role of source and drain for an active device can in some instances be reversed, so a previously indicated drain may instead be a source and vice versa. Reference to a source/drain is, therefore, intended to encompass the broadest reasonable scope of the term that is otherwise consistent with the context surrounding the reference.

Disclosed herein are stacked field effect transistor (stacked-FET) integrated circuit devices including a diffusion break region and methods for fabricating the same. While the stacked-FET integrated circuit devices described herein are suited particularly to "nanosheet"-type field effect transistors, it should be appreciated that the embodiments herein will be equally suitable for other integrated circuit configurations including a conductive gate disposed between source and drain regions of a semiconductive material, such as FinFET, planar devices, etc. As such, the following Figures should be considered as illustrative of, but not limiting to, any particular integrated circuit configuration.

Turning now to FIG. 1, illustrated is an overhead view of an integrated circuit (IC) device 30 including stacked FETs in accordance with embodiments of the present disclosure. IC device 30 includes a fin-shaped semiconductor active region 70 that is formed of a semiconductive material. The term "semiconductor" as used herein in connection with the semiconductor material of the semiconductor active region 70 (or any other semiconductor material described herein) denotes any material that exhibits semiconductor properties including, for example, Si, Ge, SiGe, SiC, SiGeC, a II/VI compound semiconductor or a III/V compound semiconductor such as, for example, InAs, GaAs, or InP. In one embodiment, the semiconductor active region 70 may be formed of silicon.

Source/drain regions 72 may be formed by introducing an n-type dopant or a p-type dopant into exposed portions of the active region 70 in the areas shown in FIG. 1, that is, areas adjacent to but not covered by the gate structures 90. As used herein, the term "adjacent" refers to a feature that is directly next to or abutting another feature. Further, the term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium, and indium. "N-type" refers to the addition of impurities that contribute free electrons to an intrinsic semiconductor. In a silicon containing semiconductor, examples of n-type dopants, i.e., impurities, include, but are not limited to, antimony, arsenic and phosphorous. The doping may be achieved utilizing ion implantation or gas phase doping. The source/drain regions 72 lie laterally adjacent to a body portion of the semiconductor active region 70.

As illustrated in FIG. 1, the semiconductor active region 70 is overlayed with a plurality of gate structures 90 which wrap around the surfaces of the semiconductor active region 70. Each gate structure 90 includes a gate dielectric portion and a gate conductor portion (not separately illustrated in the overhead view of FIG. 1). Each gate dielectric portion may include a gate dielectric material. The gate dielectric material that provides each gate dielectric portion may be an oxide, nitride, and/or oxynitride. In one example, the gate dielectric material that provides each gate dielectric portion may be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently selected from 0.5 to 3 and each value of y is independently from 0 to 2. In some embodiments, a multilayered gate dielectric structure including different gate dielectric materials, e.g., silicon dioxide, and a high-k gate dielectric can be formed and used as each gate dielectric portion. In some embodiments, each gate dielectric portion includes a same gate dielectric material. In other embodiments, at least one of the gate dielectric portions includes a different gate dielectric material than at least one other gate dielectric portion.

The gate dielectric material used in providing each gate dielectric portion may be formed by any deposition process including, for example, chemical vapor deposition (CVD), plasma enhanced chemical vapor deposition (PECVD), ALD, physical vapor deposition (PVD), sputtering, or atomic layer deposition. In some embodiments and when different gate dielectric materials are used in providing the gate dielectric portions of the different gate structures, block mask technology can be used. In one embodiment of the present disclosure, the gate dielectric material used in providing each gate dielectric portion may have a thickness in a range from 1 nm to 10 nm. Other thicknesses that are lesser than, or greater than, the aforementioned thickness range can also be employed for the gate dielectric material.

Each gate conductor portion of the gate structures 90 include a gate conductor material. The gate conductor material used in providing each gate conductor portion may include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. In some embodiments, each gate conductor portion may include the same gate conductor material. In other embodiments, at least one of the gate conductor portions include a different gate conductor material than at least one other gate conductor portion. For example, at least one of the gate conductor portions may include an nFET gate metal, while at least one other of the gate conductor portions may comprise a pFET gate metal.

The gate conductor material used in providing each gate conductor portion may be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. When a different gate conductor material is used for at least one of the gate conductor portions, block mask technology can be used. In one embodiment, the gate conductor material used in providing each gate conductor portion has a thickness from 1 nm to 100 nm. Other thicknesses that are lesser than, or greater than, the aforementioned thickness range may also be employed for the gate conductor material used in providing each gate conductor portion. In accordance with conventional IC terminology, the source/drain 72 and gate structures 90 are each referred to herein as "terminals", denoting that electrical contact may be made thereto with an appropriate conductive contact structure, as will be described in greater detail below.

The Figures following FIG. 1, disclosing embodiments of the present disclosure, are illustrated in cross-section, as opposed to the overhead view of FIG. 1. Accordingly, FIG. 1 illustrates a cross-sectional plane 50 through which the following Figures may be illustrated. The cross-sectional plane 50 passes lengthwise through the active region 70 and widthwise through each conductive gate structure 90.

The fabrication of a first embodiment of the present disclosure is described in connection with FIGS. 2-17. Referring now to FIG. 2, a first level integrated circuit structure 100 is illustrated. In one embodiment, the first level IC structure 100 of the present disclosure may be configured as a semiconductor-on-insulator (SOI) wafer. The SOI wafer may include the substrate 102 and an insulating layer 104 on the substrate 102. This insulating layer 104 may, for example, include a buried oxide (BOX) layer or some other suitable insulating layer. An active surface semiconductor layer may be processed on the BOX layer 104 to form a nanosheet stack including alternative layers of sacrificial silicon germanium (SiGe) sacrificial material and nanosheet channel layers 110, and in the subsequent process flow, the sacrificial layer is to be replaced by inner spacer 111 and replacement gate 106. In the case of buried oxide layer 104, that layer may have a thickness of from about 100 to about 400 nm. Overlying the BOX layer 104, the first level IC structure 100 of the present disclosure includes a plurality of transistors, each of which include gate, source, drain, and channel structures. In one exemplary embodiment, the first level IC structure 100 may be fabricated using nanosheet transistor structures.

With continued reference to FIG. 2, a nanosheet-based FET includes source and drain regions 108 and stacked nanosheet channels 110 between the source and drain regions 108. A gate 106 surrounds the stacked nanosheet channels 110 and regulates electron flow through the nanosheet channels 110 between the source and drain regions 108. Nanosheet channels 110 may be fabricated by forming alternating layers of nanosheet channels 110 and sacrificial nanosheets (not illustrated). In this process, the sacrificial nanosheets may be etched from the channel nanosheets before the FET device is finalized. Nanosheet channels 110 may be formed of typical semiconductor materials that are consistent with the embodiments of this disclosure. For example, n-type nanosheet channels 110 may be formed of silicon (Si), and the corresponding sacrificial nanosheets may have been formed of silicon germanium (SiGe). P-type nanosheet channels 110, on the other hand, may be formed of SiGe and the sacrificial nanosheets may have been formed of Si. In some implementations, the channel nanosheet 110 of a p-type FET can be SiGe or Si, and the sacrificial nanosheets can be Si or SiGe.

The IC structure shown in FIG. 2 further includes offset gate spacers 112 formed by conformal deposition of a dielectric material (e.g., an oxide and/or a nitride) over all exposed surfaces of the IC structure 100 followed by a directional etch (e.g., reactive ion etching; "RIE") to form the offset gate spacers 112. In some embodiments of the disclosure, the offset gate spacers 112 may include silicon oxide, silicon nitride, silicon oxynitride, SiBCN, SiOCN, SiOC, or any suitable combination of those materials. After spacer 112 formation, the exposed nanosheet stack 110 at the source/drain regions 108 is etched, followed by SiGe indentation and inner spacer 111 formation.

Then, doped source/drain regions 108 on the end regions of the channel nanosheets 110 are formed. The doped source/drain regions 108 may be formed by a variety of methods, such as, for example, in-situ doped epitaxy, doping following the epitaxy, implantation and plasma doping, ultrahigh vacuum chemical vapor deposition (UHVCVD), rapid thermal chemical vapor deposition (RTCVD), metal organic chemical vapor deposition (MOCVD), low-pressure chemical vapor deposition (LPCVD), limited reaction processing CVD (LRPCVD), and MBE. In some embodiments of the disclosure, the doped source/drain regions 108 may be doped during deposition (in-situ doped) by adding dopants such as n-type dopants (e.g., phosphorus or arsenic) or p-type dopants (e.g., Ga, B, $BF_2$, or Al). Overlying the source/drain regions may be an interlayer dielectric (ILD) 114, such as a nitride or oxide material.

The gate structures shown in FIG. 2 may be provided as a high-k metal gate (HKMG) structure 106 having a dielectric layer and a metal gate structure (not shown separately). The metal gate structure may include conductive metals and work-function metals (WFM). In embodiments, the WFM can be, for example, TiN, TiAl, TiC, TiAlC, or TaN, and the conductive metal may be aluminum or tungsten. The dielectric layer may include interfacial layers (IL) and high-k dielectric layers. In some embodiments of the disclosure, the high-k dielectric layers can modify the work function of the WFM. The high-k dielectric layer can be made of, for example, silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials may further include dopants such as lanthanum and aluminum.

Referring now to FIG. 3, fabrication of the stacked-FET integrated circuit devices of the present disclosure includes the formation of a dielectric layer 122 overlying the first level integrated circuit structure 100, which may include silicon oxide, silicon nitride, silicon oxynitride, SiBCN, SiOCN, SiOC, or any suitable combination of those materials. Dielectric layer 122 may be formed using, for example, chemical vapor deposition (CVD), plasma enhanced chemical vapor deposition (PECVD), physical vapor deposition (PVD), sputtering, or atomic layer deposition. Thereafter, photolithographic masks may be utilized to define an area of the dielectric layer 122 to be etched or otherwise processed for the formation of a "dummy" local interconnect structure 124. As used herein, the term "dummy" refers to a place holder structure that will later be removed in favor of the permanent structure. The material used for the dummy local interconnect structure 124 may include a readily-etchable metal oxide, such as titanium oxide, for example. This material is deposited into the area defined by the photolithographic mask.

Figure 4:
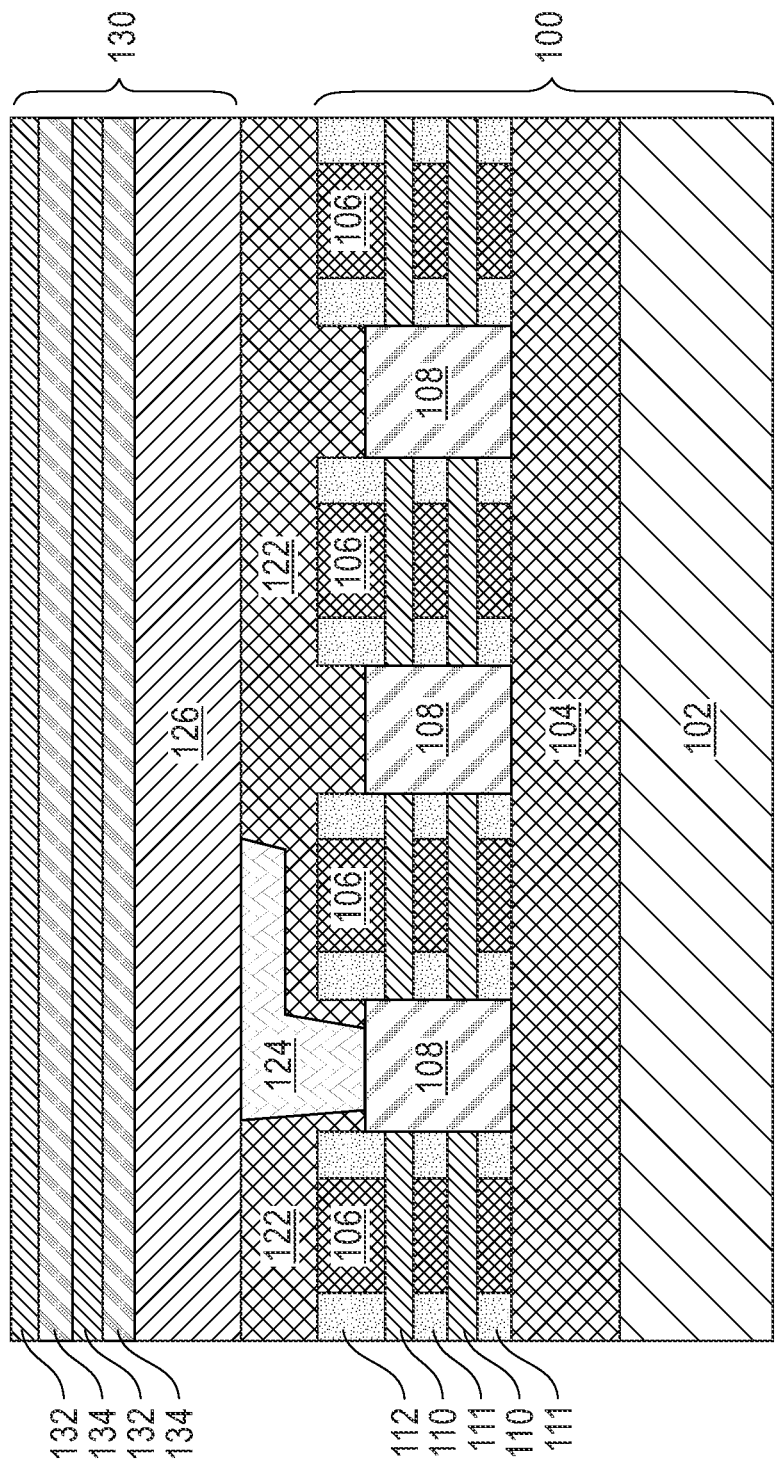

Referring now to FIG. 4, illustrated is the initial step in the fabrication of a second level IC structure (top semiconductor layer) 130 over the dielectric layer 122 and the dummy local interconnect structure 124. The top semiconductor layer 130 may be formed over bottom wafer 100 by conventional wafer bonding process. Here, a dielectric-to-dielectric bonding process is used, and layer 126 may be the bonding oxide. After wafer bonding, the top semiconductor layer 130 is be thinned down to keep the remaining semiconductor layer over bonding oxide 126 to serve as active region for top transistors to be formed. This layer 126 may have a thickness of from about 100 to about 400 nm, in some embodiments.

Here, for illustrational purposes, the top semiconductor layer 130 is also a nanosheet device, such that the top semiconductor material includes alternating sacrificial nanosheets 134 and channel nanosheets 132. As noted above, GAA nanosheet FETs are fabricated by forming alternating layers of channel nanosheets 132 and sacrificial nanosheets 134. The sacrificial nanosheets 134 are released from the channel nanosheets 132 before the FET device is finalized. For n-type FETs, the channel nanosheets 132 are typically silicon (Si) and the sacrificial nanosheets 134 may be silicon germanium (SiGe). For p-type FETs, the channel nanosheets 132 can be SiGe and the sacrificial nanosheets 134 may be Si. In some implementations, the channel nanosheets 132 of a p-type FET may be SiGe or Si, and the sacrificial nanosheets 134 may be Si or SiGe.

Figure 5:
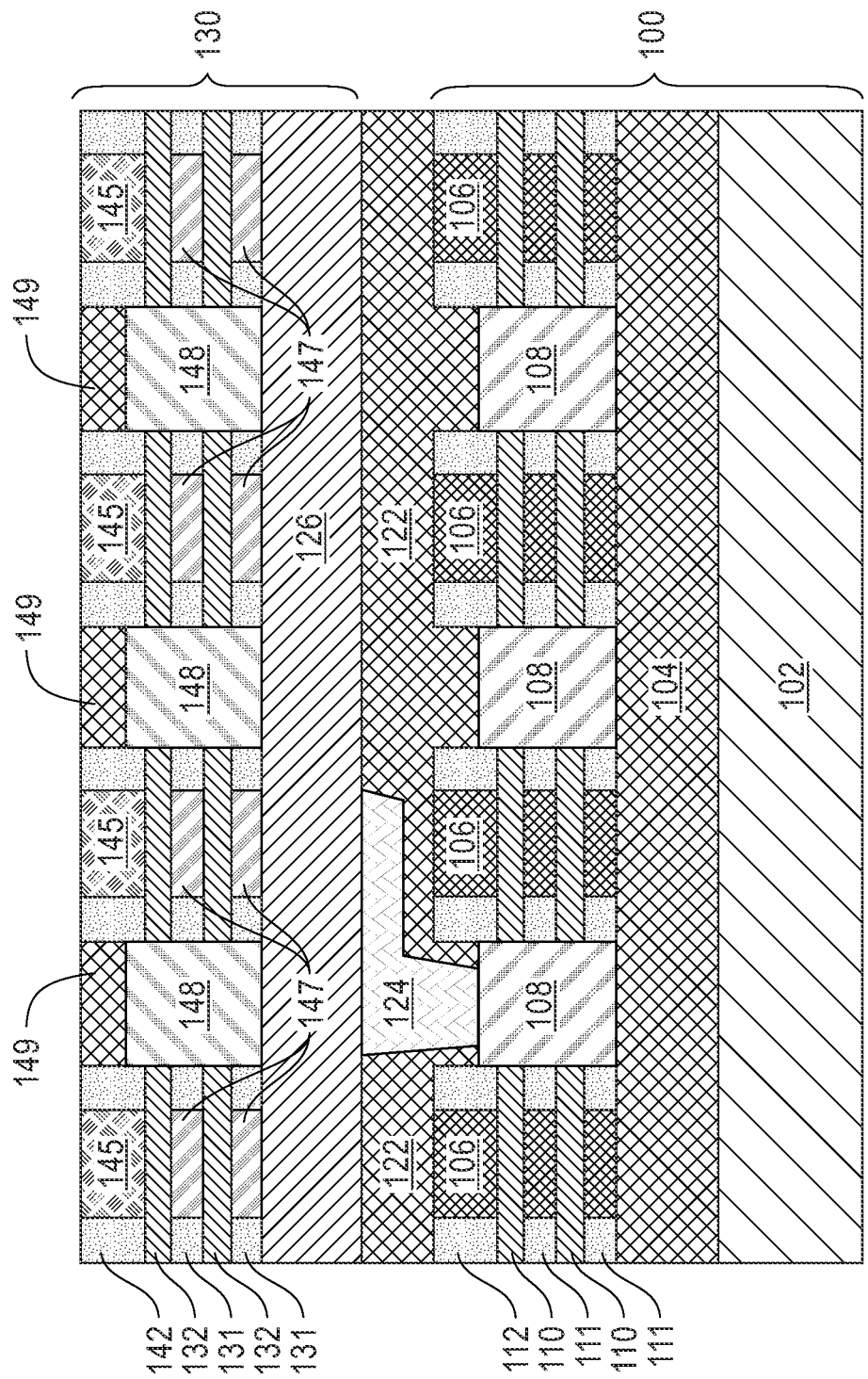

With reference now to FIG. 5, illustrated are "dummy" gates 145, which are replaced later in the fabrication process in favor of the conductive gates forming the second level IC structure 130. The dummy gates 145 may be formed from amorphous silicon (a-Si) by depositing a thin layer of gate oxide (not shown separately from the dummy gates 145) over the channel nanosheets 132 then depositing a layer of a-Si (not shown) over the gate oxide. The a-Si is planarized (e.g., by CMP) to a desired level. A patterned hard mask (e.g., a nitride) (not shown) is deposited over the planarized a-Si. The pattern of the hard mask defines the footprints of the dummy gates 145 and the gate oxide. An etch (e.g., an RIE) or a recess is applied to remove the portions of the a-Si layer and the gate oxide that are not covered by the patterned hard mask to form dummy gate caps (formed from the patterned hard mask material) and the dummy gates 145 over the channel nanosheets 132. The second level IC structure 130 further includes offset gate spacers 142 formed by a conformal deposition of a dielectric material (e.g., an oxide and/or a nitride) over all exposed surfaces of the IC structure 130 followed by a directional etch (e.g., reactive ion etching; "RIE") to form the gate spacers 142. In some embodiments of the disclosure, the offset gate spacers 142 may include silicon oxide, silicon nitride, silicon oxynitride, SiBCN, SiOCN, SiOC, or any suitable combination of those materials. After which, the exposed channel nanosheets 132 are recessed, followed by SiGe sacrificial nanosheet indentation (147) and inner spacer 131 formation.

Doped source/drain regions 148 on the end regions of the channel nanosheets 132 are then formed. The doped source/drain regions 148 may be formed by a variety of methods, such as, for example, in-situ doped epitaxy, doping following the epitaxy, implantation and plasma doping, ultrahigh vacuum chemical vapor deposition (UHVCVD), rapid thermal chemical vapor deposition (RTCVD), metal organic chemical vapor deposition (MOCVD), low-pressure chemical vapor deposition (LPCVD), limited reaction processing CVD (LRPCVD), and MBE. In some embodiments of the disclosure, the doped source/drain regions 148 may be doped during deposition (in-situ doped) by adding dopants such as n-type dopants (e.g., phosphorus or arsenic) or p-type dopants (e.g., Ga, B, $BF_2$, or Al). Overlying the source/drain regions may be a dielectric capping layer 149, such as a nitride or oxide material.

Figure 6:
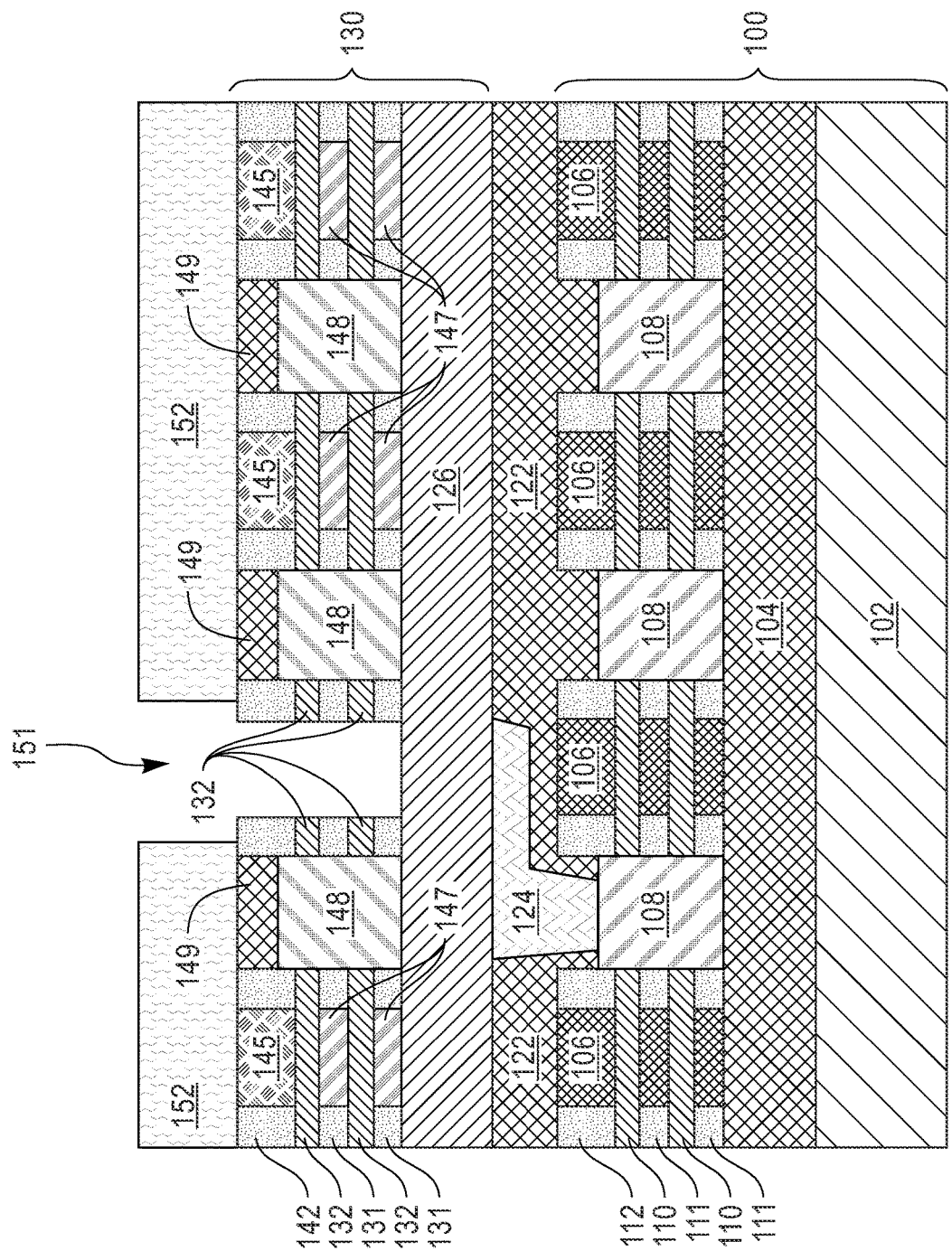

With reference now to FIG. 6, an organic planarization layer (OPL) 152 is deposited over the second level IC 130. The OPL 152 may be an organic polymer, such as polyacrylate resin, epoxy resin, phenol resin, polyamide resin, polyimide resin, unsaturated polyester resin, polyphenylenether resin, polyphenylenesulfide resin, or benzocyclobutene (BCB). An opening 151 may be formed through the OPL layer using photolithography and etch processes. For example, an antireflective coating, e.g., SiARC, may be formed atop the OPL layer 152, followed by a photoresists mask. For example, a photoresist mask may be formed overlying the OPL layer 152 using deposition and photolithography, in which the openings in the photoresist mask correspond to the portions of the OPL layer 152 that are etched to provide the opening 151.

More specifically, in one embodiment, a photoresist pattern (also referred to as photoresist mask) is produced by applying a photoresist to the surface to be etched; exposing the photoresist to a pattern of radiation; and then developing the pattern into the photoresist utilizing a resist developer. Once the patterning of the photoresist is completed, the sections covered by the photoresist are protected while the exposed regions are removed using a selective etching process that removes the unprotected regions. The exposed portions of OPL layer 152 may then be etched to provide the opening 151 using the photoresist mask as an etch mask. The etch process for forming the opening 151 may include an anisotropic etch, such as reactive ion etch, laser etching, plasma etching, or a combination thereof. The opening 151 is disposed over one of the dummy gates 145. With further etching, as described above, the exposed dummy gate 145 (and associated portions of the channel nanosheets 132) are removed as well, thereby exposing a portion of insulating layer 126 within the opening 151, as illustrated in FIG. 6.

Figure 7:
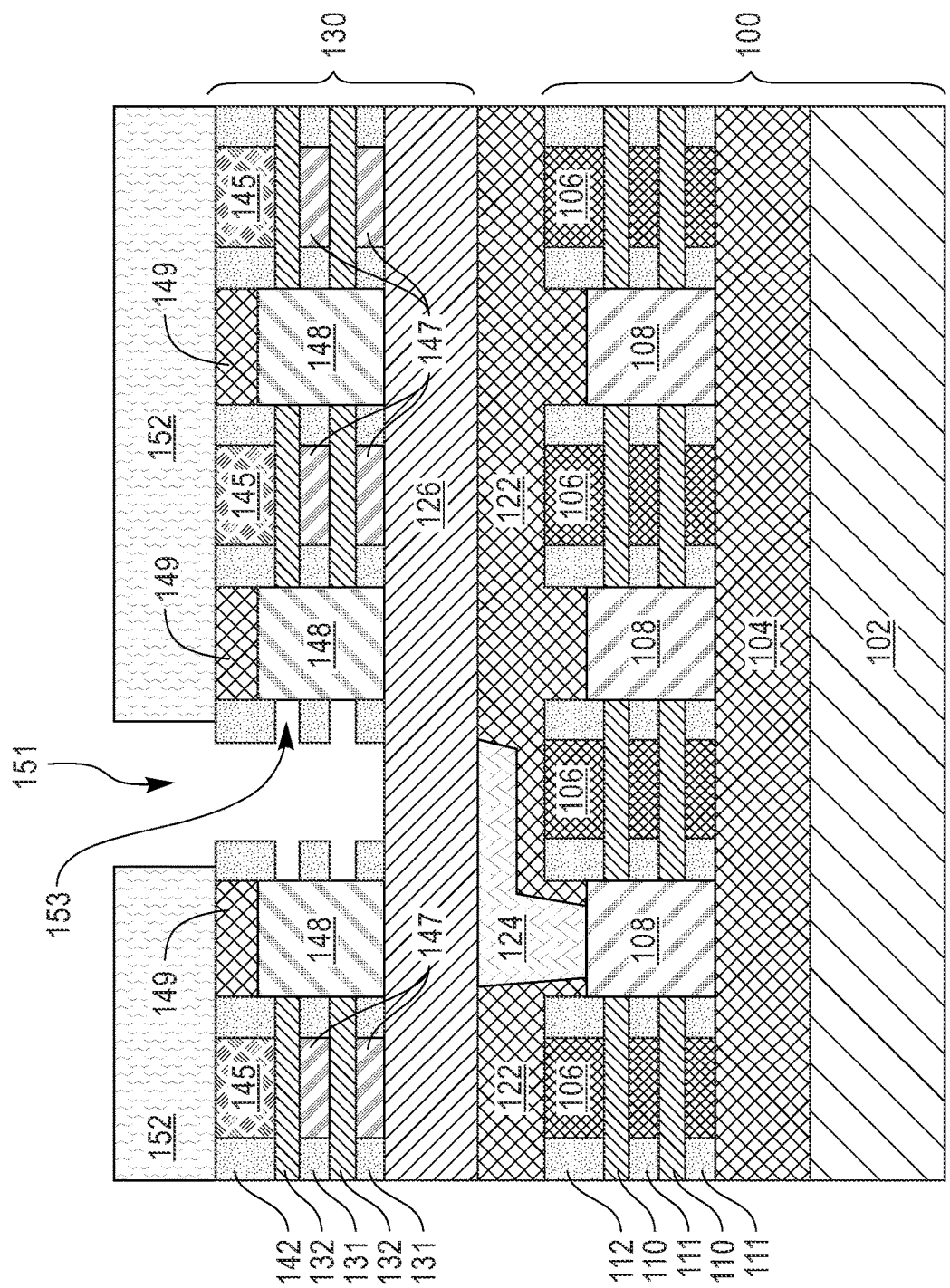

Furthermore, as shown in FIG. 7, the portions of the channel nanosheets 132 extending into the offset gate spacers 142 on either side of the removed dummy gate 145 are etched away in a subsequent selective etching step, thereby exposing channel void spaces 153.

Figure 8:
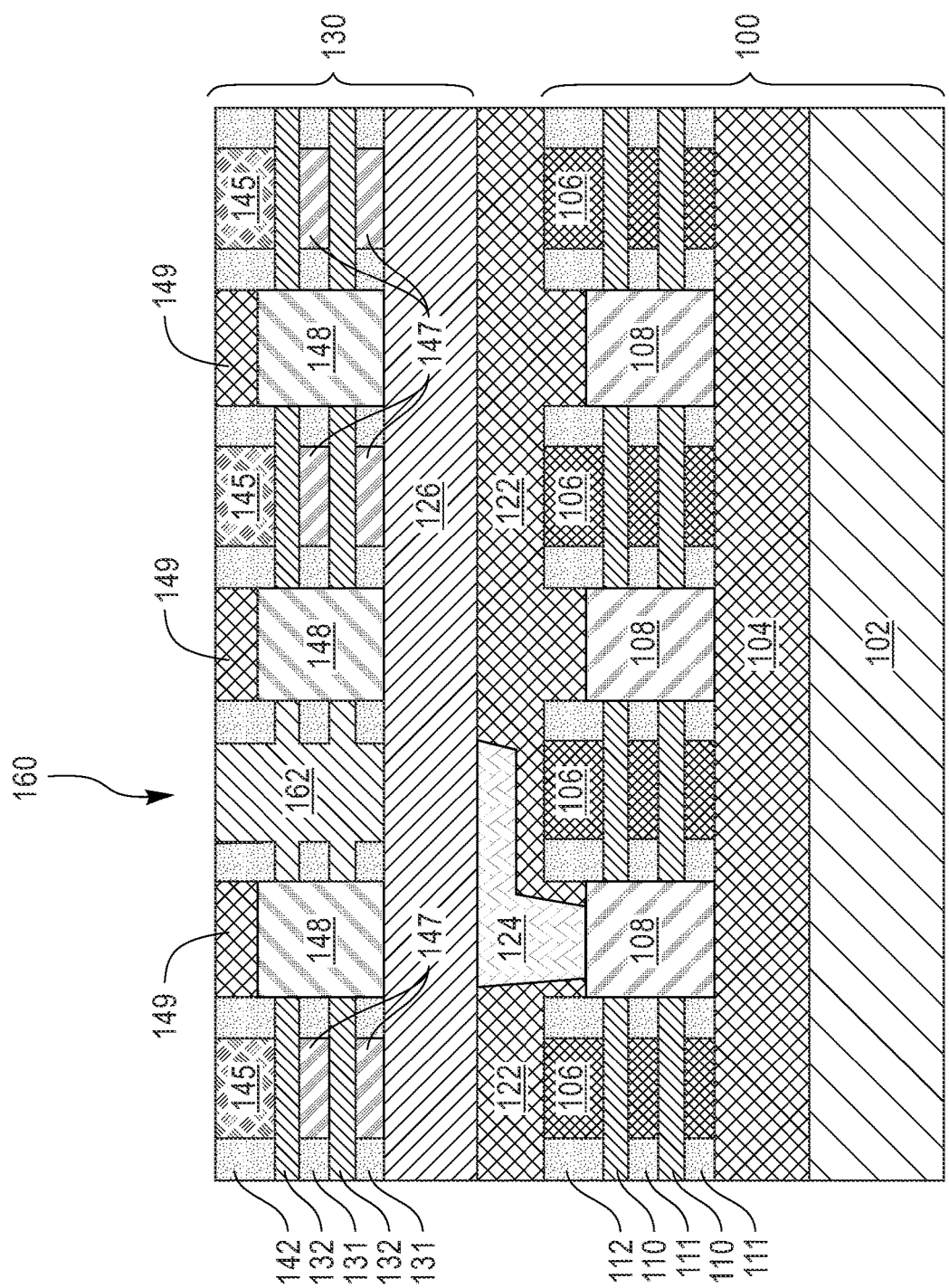

Referring now to FIG. 8, remaining (previously masked) portions of the OPL layer 152 are removed, for example via planarization, and the opening 151 and the channel void spaces 153 are filled in with a dielectric material 162, which may include silicon oxide, silicon nitride, silicon oxynitride, SiBCN, SiOCN, SiOC, or any suitable combination of those materials. Dielectric material 162 may be formed using, for example, chemical vapor deposition (CVD), plasma enhanced chemical vapor deposition (PECVD), physical vapor deposition (PVD), sputtering, or atomic layer deposition. The dielectric material within the opening 151 and the channel void spaces 152 forms a "diffusion break dielectric fill region" 160. The diffusion break fill region 160 is provided to interrupt the continuity of the semiconductive "fin" between source/drain regions 148. As will be described in greater detail below, the diffusion break fill region 160 is provided for electrical isolation of a conductive interconnect formed within the region 160.

Figure 9:
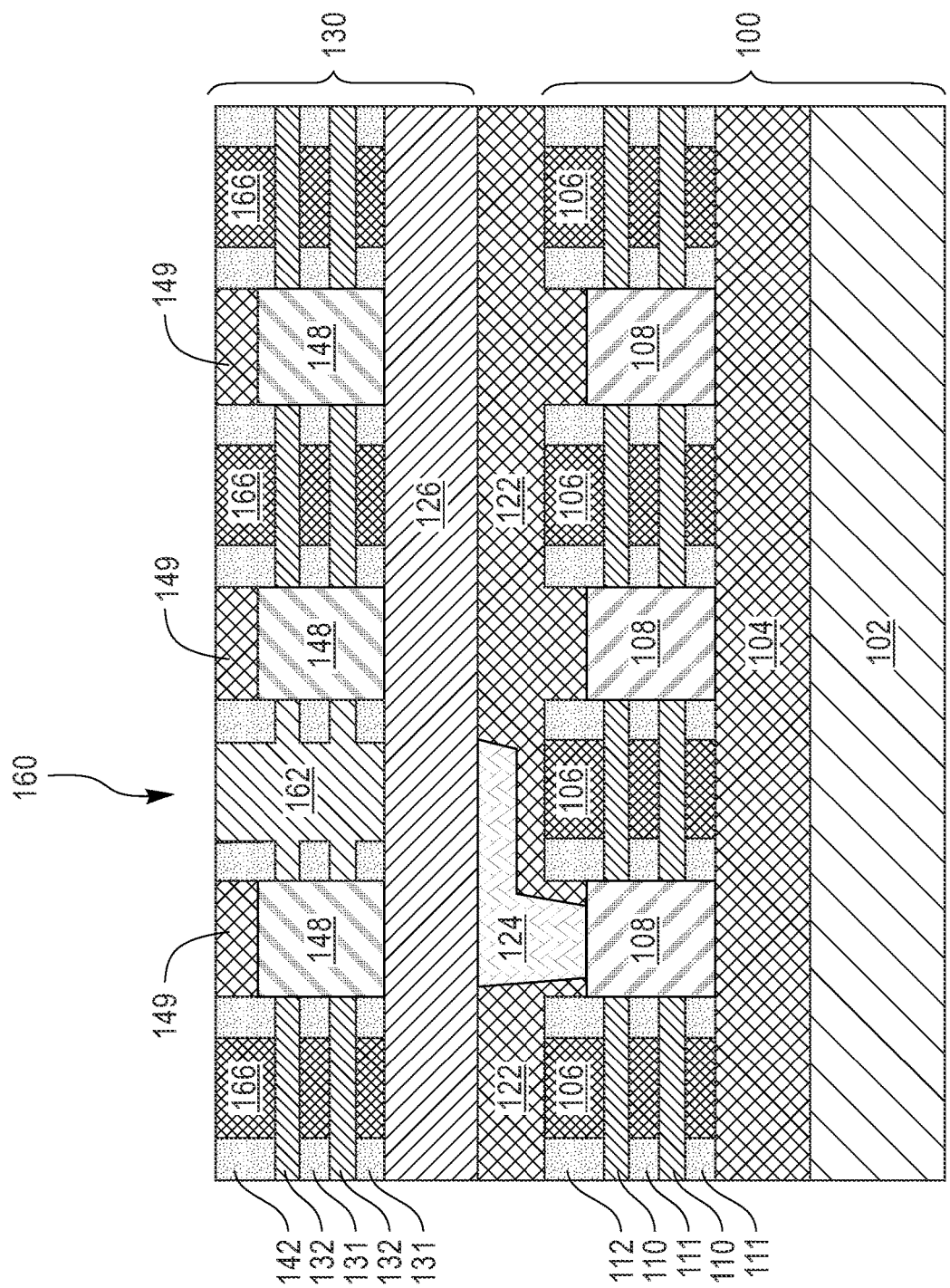

Referring now to FIG. 9, the dummy gate structures 145 and sacrificial nanosheet layers 147 are replaced with gate structures 166. For example, the dummy gate 145 and sacrificial nanosheet (SiGe) layers 147 may be removed by a known etching process, e.g., RIE or wet removal process. Known fabrication operations are used to replace the removed dummy gates 145 with a high-k metal gate (HKMG) structure 166 having a dielectric layer (not shown separately) and a metal gate structure. The metal gate structure can include conductive metals and work-function metals (WFM). In embodiments of the invention, the WFM can be, for example, TiN, TiC, TiAl, TiAlC, or TaN, and the conductive metal can be aluminum or tungsten. The dielectric layer can include interfacial layers (IL) and high-k dielectric layers. In some embodiments of the invention, the high-k dielectric layers can modify the work function of the WFM. The high-k dielectric layer can be made of, for example, silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials can further include dopants such as lanthanum and aluminum.

Figure 10:
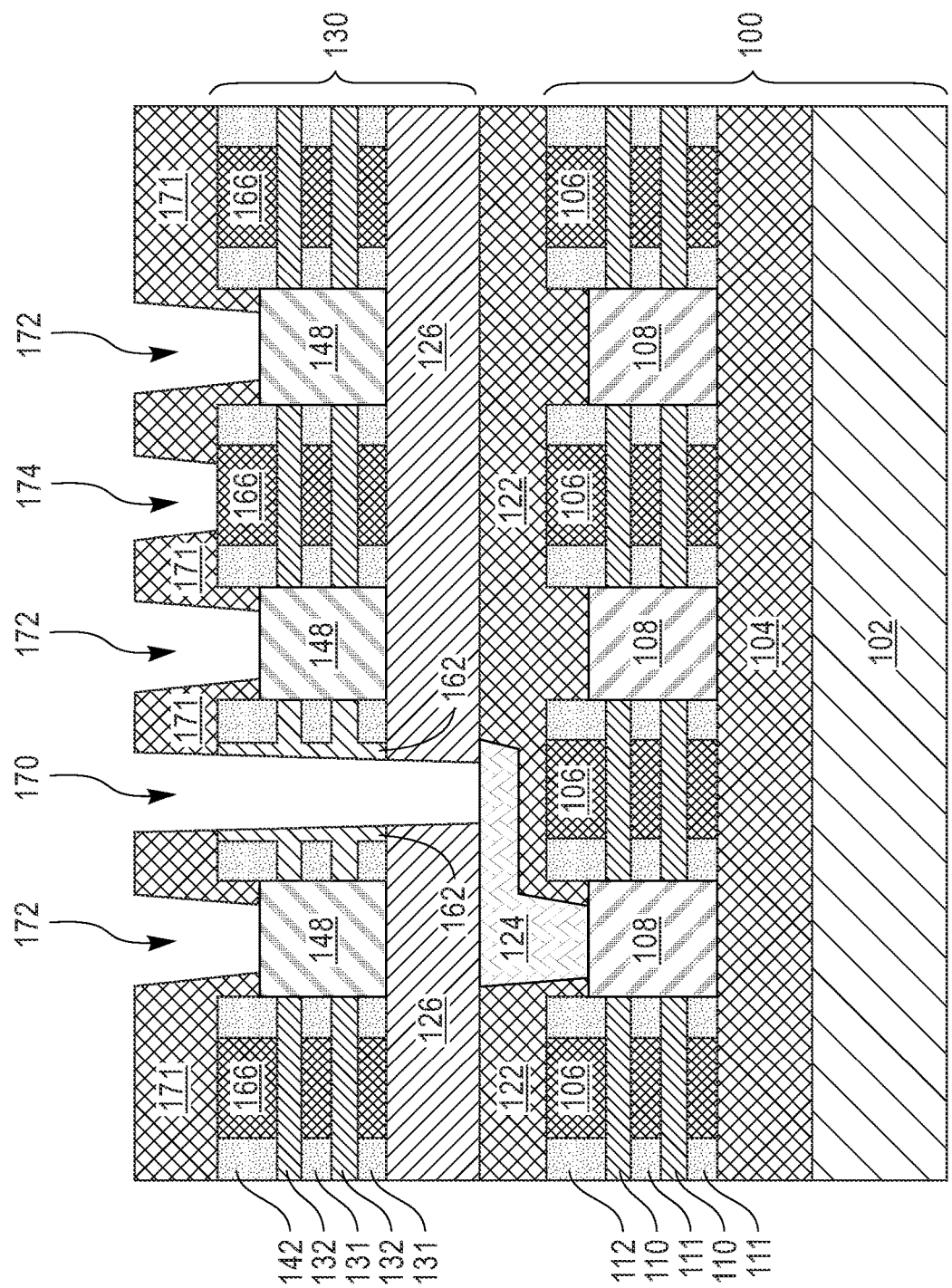

Referring to FIG. 10 now, a second level IC patterning process is performed. The second level IC patterning process includes forming a dielectric layer 171 over the top of the second level IC 130, which may include silicon oxide, silicon nitride, silicon oxynitride, SiBCN, SiOCN, SiOC, or any suitable combination of those materials. Dielectric layer 171 may be formed using for example, chemical vapor deposition (CVD), plasma enhanced chemical vapor deposition (PECVD), physical vapor deposition (PVD), sputtering, or atomic layer deposition. MOL contact openings 170, 172 and 174 are formed by conventional lithography patterning and etching process.

As shown in FIG. 10, opening 170 is etched so as to pass through the dielectric layer 171, the diffusion break fill region 160, and the insulating layer 126, thereby exposing the dummy local interconnect structure 124. The openings 172 are etched so as to pass through the dielectric layer 171 and the dielectric capping layer 149, thereby exposing the source/drain structures 148. Furthermore, the opening 174 is etched so as to pass through the dielectric layer 171, thereby exposing one of the gate structures 166.

Figure 11:
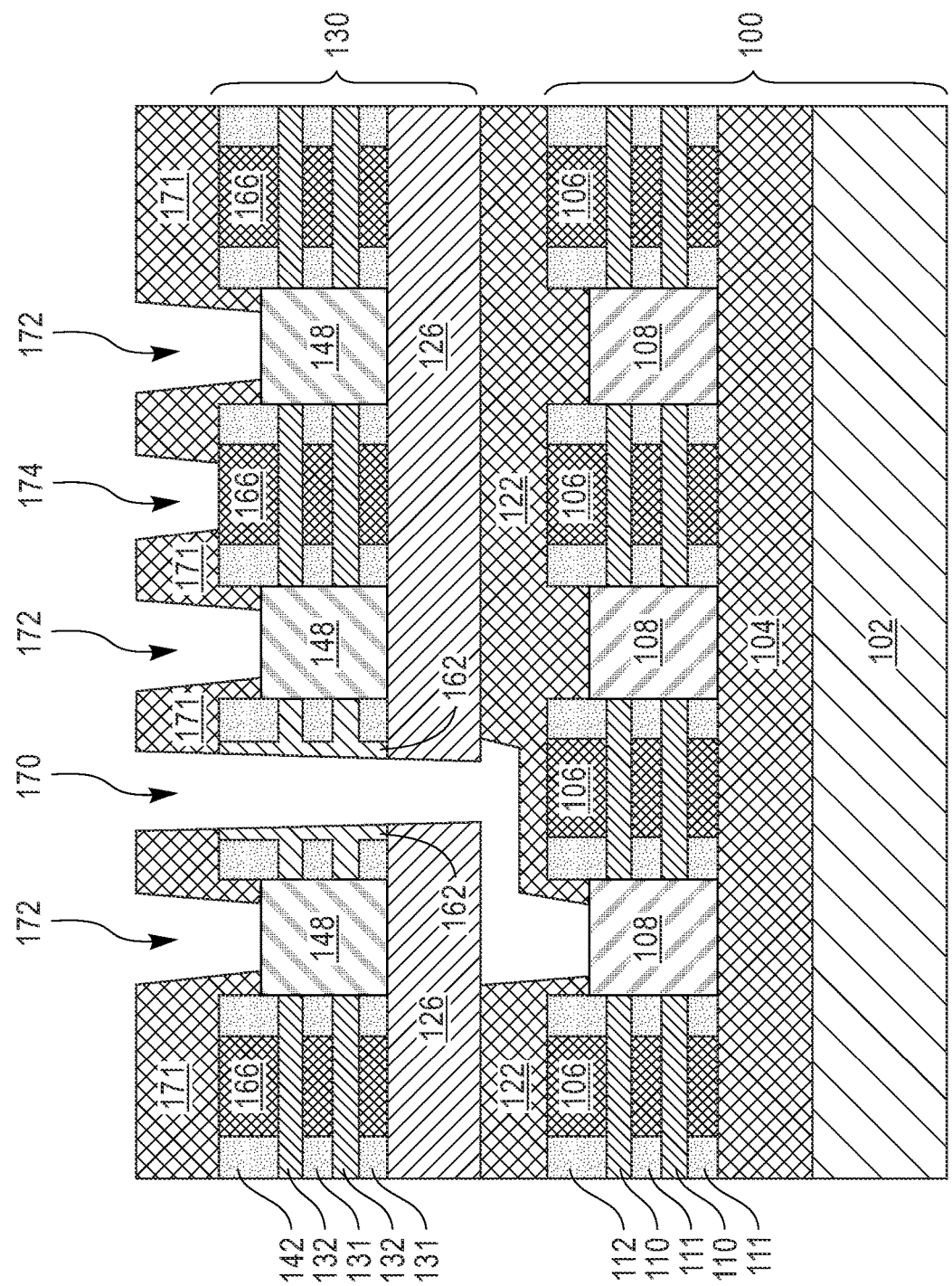

As shown in FIG. 11, a further selective etching step is performed to remove the dummy local interconnect structure 124, thereby extending opening 170 to expose a source/drain region 108 of the first level IC 100.

Figure 12:
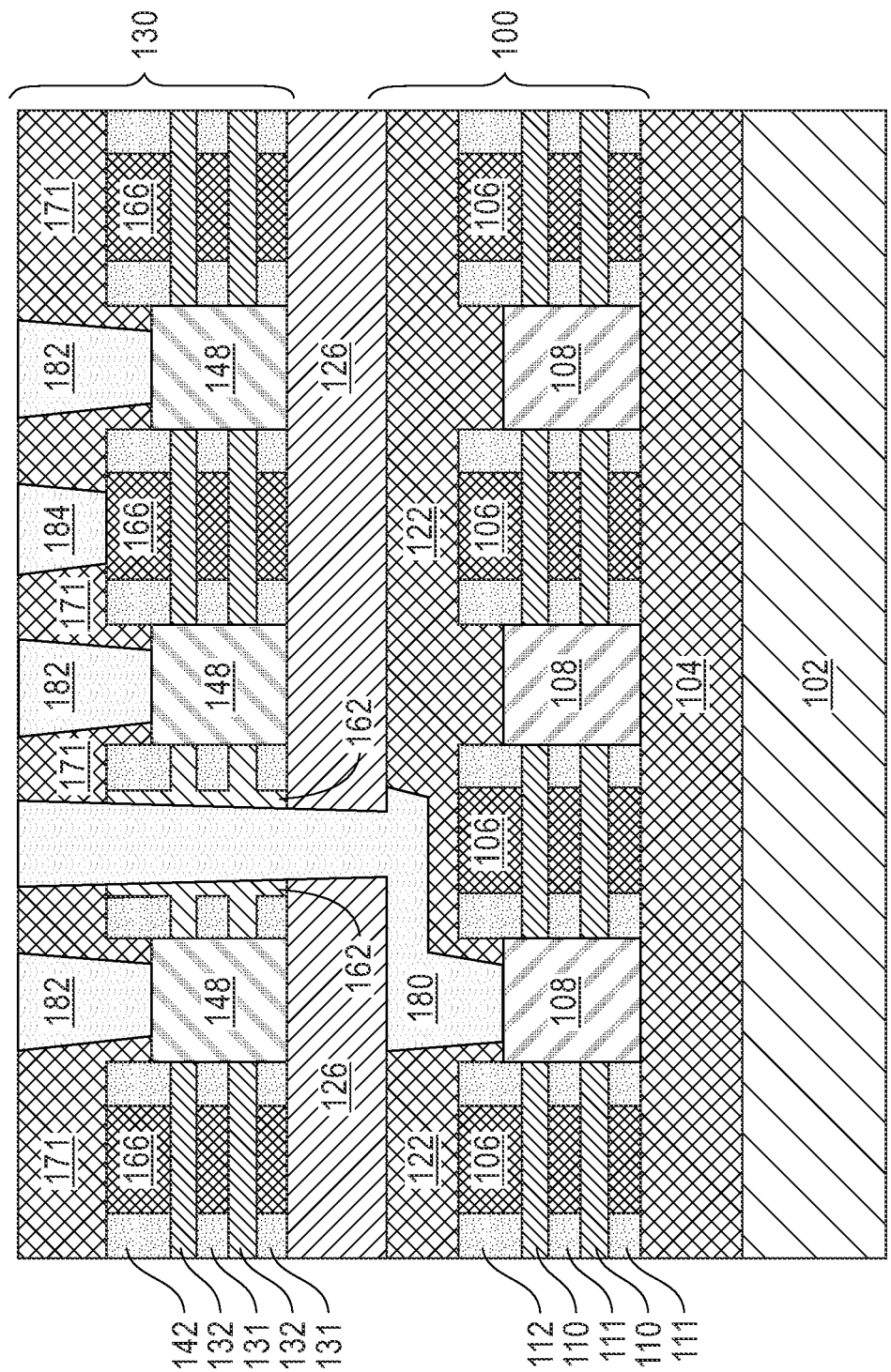

Referring now to FIG. 12, a conductive metallic contact material is formed within the openings 170, 172, and 174. The metallic contact material forms a local interconnect structure 180 extending from the bottom source/drain region 108 of the first level IC 100, then laterally through the dielectric layer 122, and further through the insulating layer 126 and the remaining diffusion break fill material 162. The metallic contact material further forms contact structures 182 and 184, which respectively extend to the source/drain structures 148 and the gates 166 of the second level IC 130. Forming the local interconnect structure 180 and the contact structures 182, 184 may include forming a contact liner followed by an electrically conductive fill material. The contact liner may be a silicide liner such as Ti, Ni, NiPt, and a diffusion barrier or adhesion layer such as TiN that can be deposited using at least one of atomic layer deposition (ALD), chemical vapor deposition (CVD), plasma vapor deposition (PVD), pulsed nucleation layer (PNL), pulsed deposition layer (PDL), plasma-enhanced ALD and plasma-enhanced CVD. The conductive fill material may be composed of a metal, such as copper, aluminum, tungsten, or ruthenium, for example. The electrically conductive fill material may be formed using a deposition method, such as CVD, plating, or PVD. Following deposition, the upper surface of the electrically conductive fill material may be planarized, e.g., planarized by chemical mechanical planarization (CMP), resulting in the structure shown in FIG. 12.

Figure 13:
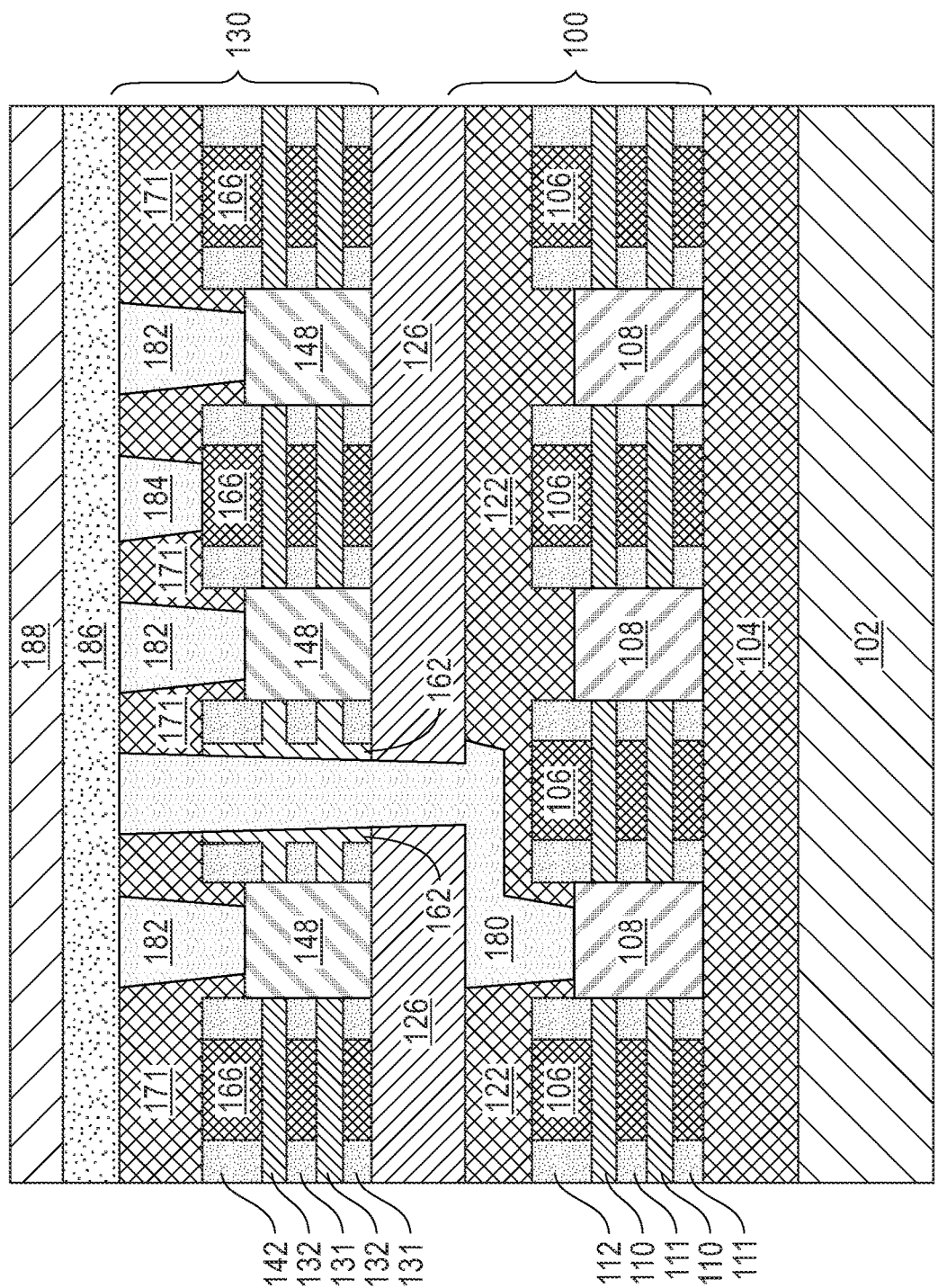

Referring now to FIG. 13, a back-end-of-line (BEOL) layer 186 is formed over the local interconnect 180 and contact structures 182, 184. Forming the BEOL layer 186 is a portion of the IC fabrication process where the individual devices (transistors, capacitors, resistors, etc.) get interconnected with wiring on the wafer, i.e. a metallization layer. Suitable metals include copper and aluminum, for example. BEOL layer 186 generally includes a first layer of metal deposited on the wafer. The BEOL layer 186 may further includes contacts, insulating layers (dielectrics), metal levels, and bonding sites for chip-to-package connections. Over the BEOL layer 186 is then bonded a further carrier substrate 188. Further carrier substrate 188, similar to carrier substrate 102, may be any of a variety of insulative or semiconductor materials such as, for example, silicon, fused silica (glass, quartz), ceramic, or another semiconductor or insulator.

Figure 14:
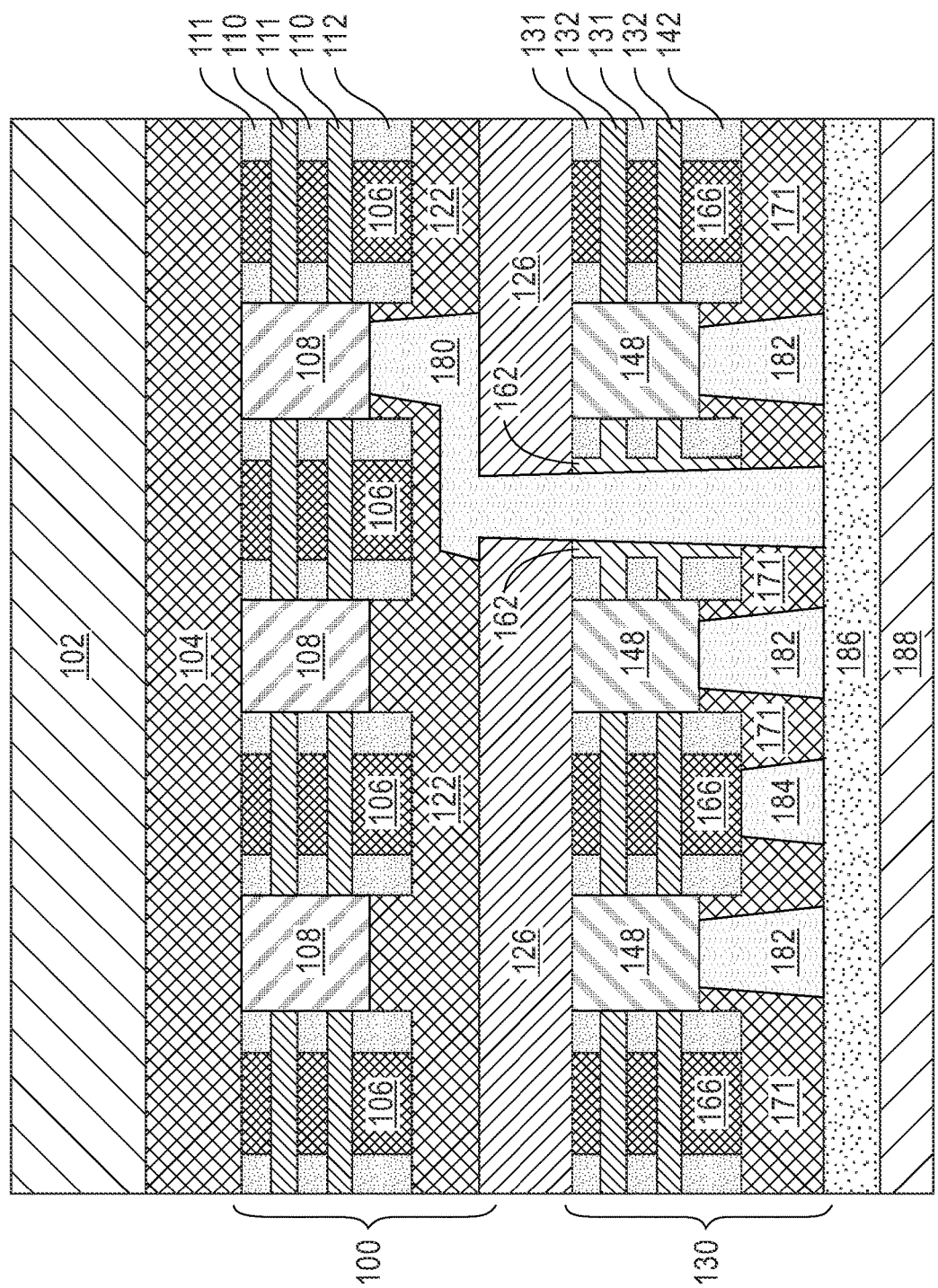

Thereafter, as shown in FIG. 14, in the semiconductor fabrication line, the structure shown in FIG. 13 is "flipped" to expose the carrier substrate 102 for further processing.

Figure 15:
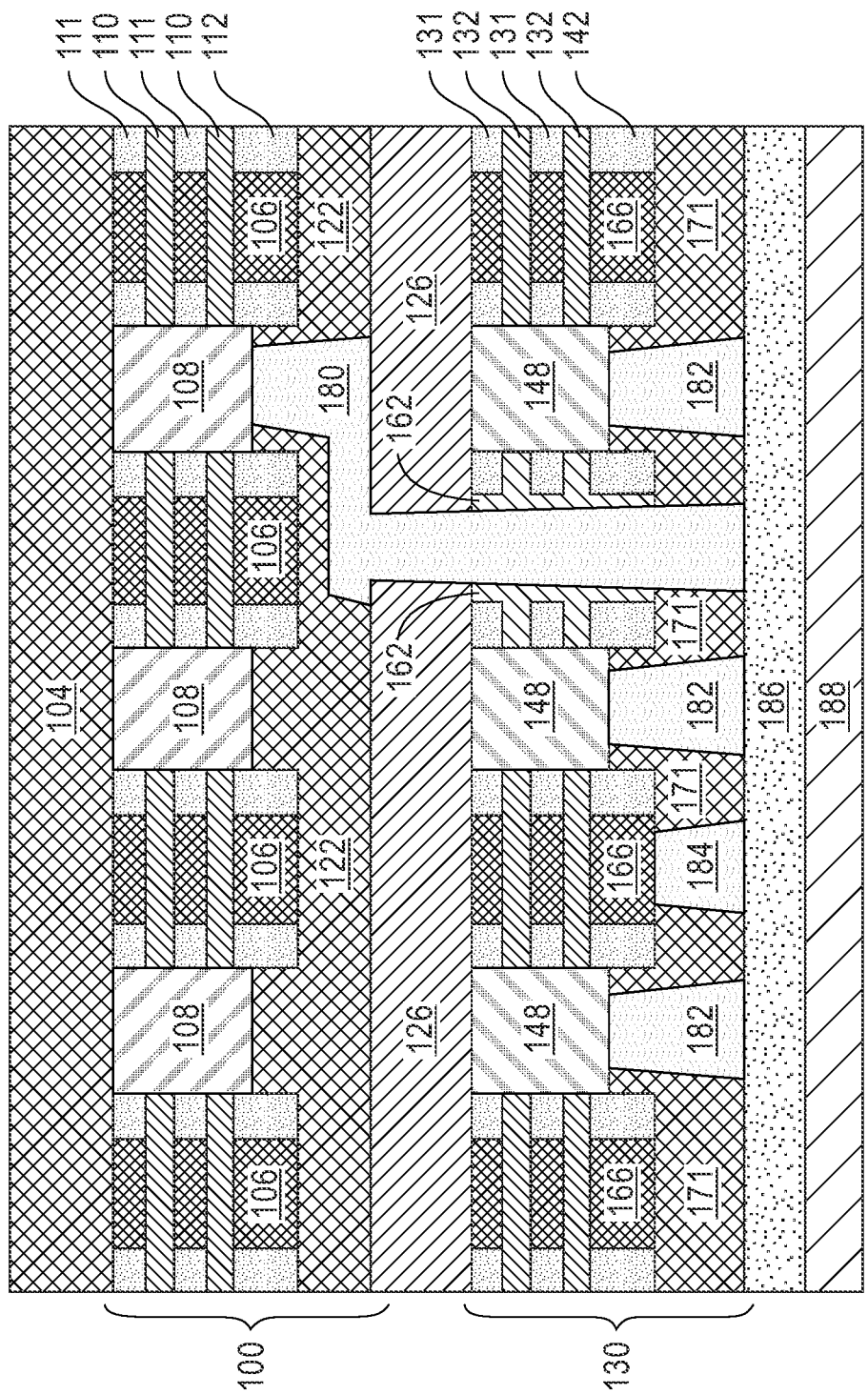

Referring now to FIG. 15, the substrate 102 of the first level IC is removed, for example by a combination of grinding, CMP, and/or wet/dry etching, as described above, thereby exposing BOX layer 104.

Figure 16:
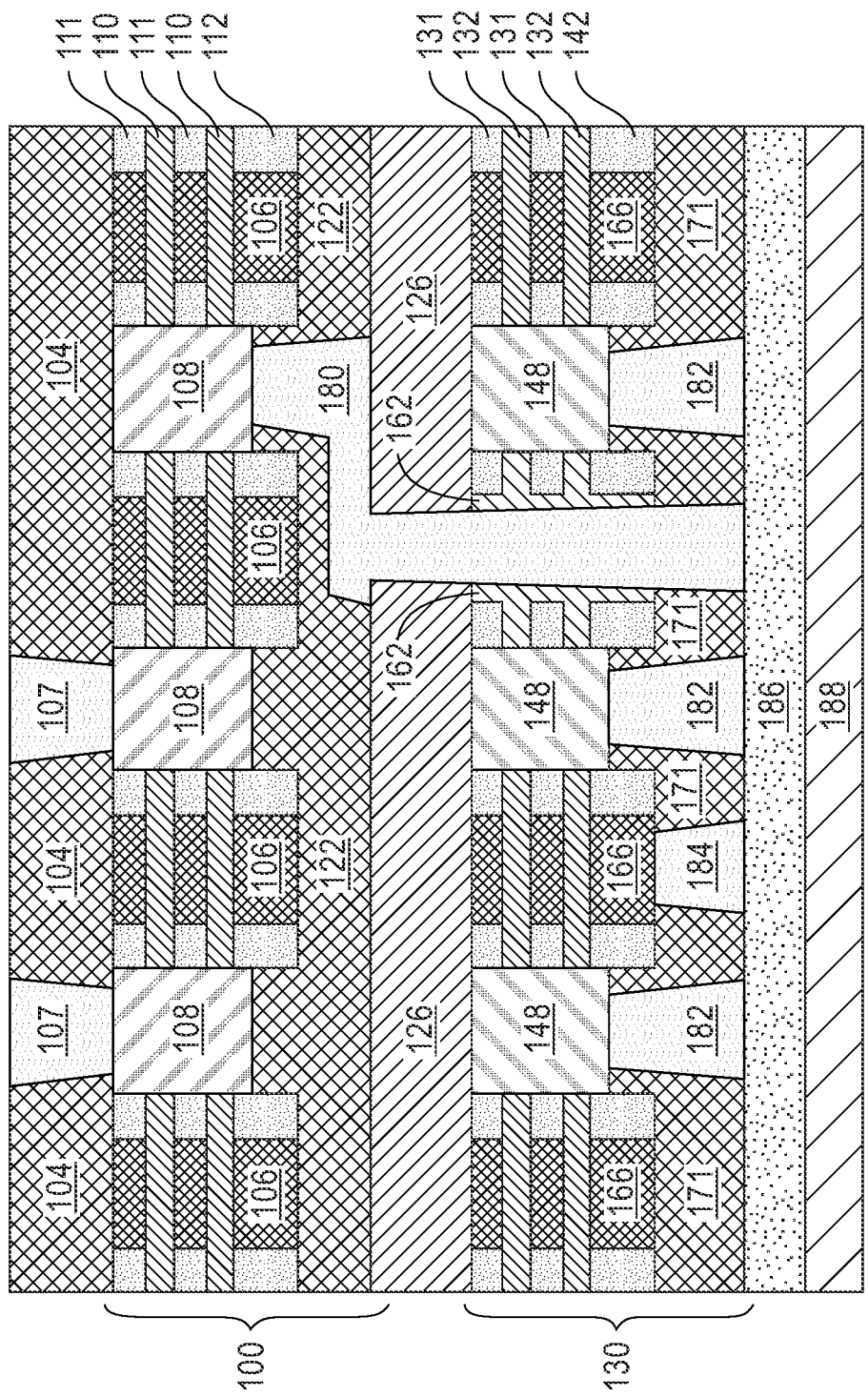

With reference to FIG. 16, conductive backside contact structures 107 are formed within the BOX layer to the bottom source/drain structures 108 using masking, patterning, etching, and fill procedures substantially as described above with regard to FIGS. 10-12, the procedure for which is not elaborated here again to avoid repetition.

Figure 17:
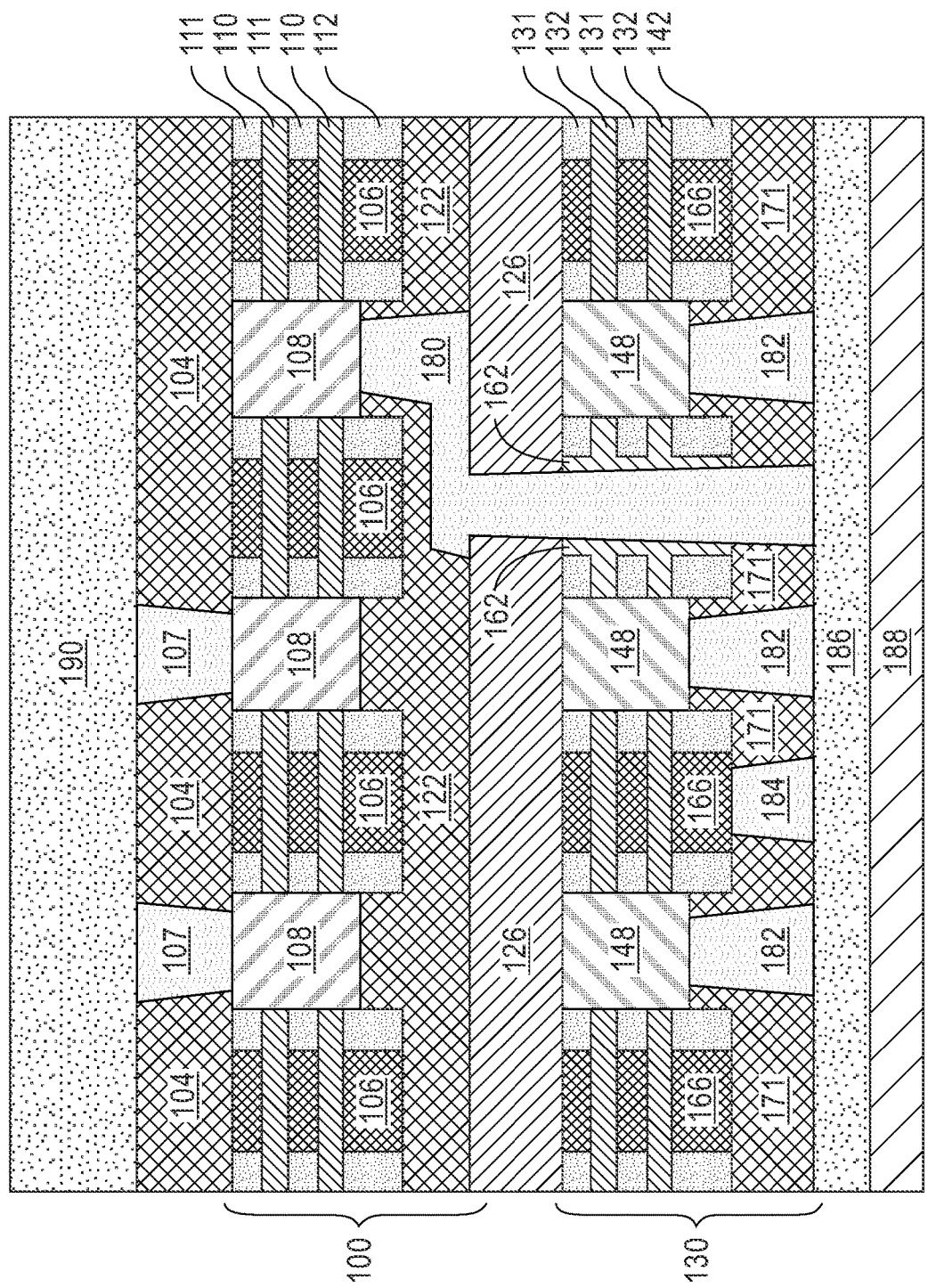

Thereafter, with reference to FIG. 17, a backside power rail (BPR)/backside power delivery network (BSPDN) layer 190 is provided to provide electrical power to the fabricated IC device. The BPR/BSPDN layer 190 overlies the BOX layer 104 and the contact structures 107. FIG. 17 therefore illustrates the completed IC structure of the first embodiment.

In contrast to the foregoing method described in connection with FIGS. 1-17, prior art FET stacking approaches previously required complicated fabrication processes. In addition, such vertical device architectures made the formation of contact structures for the vertically stacked FETs very difficult. Thus, the foregoing provides an improvement in forming 3D stacked transistors as well as contact structures to such 3D stacked transistors.

Figure 18:
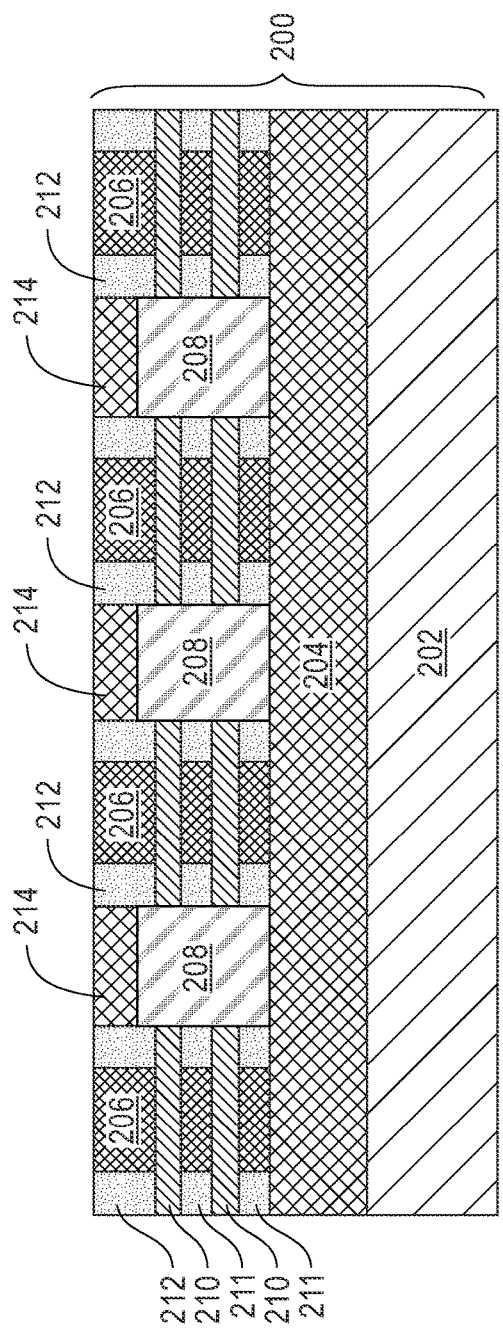
FIGS. 18-21 provide cross-sectional views illustrating procedures in the fabrication of a stacked-FET IC device in accordance with a second embodiment of the present disclosure.

The fabrication of a second embodiment of the present disclosure is described in connection with FIGS. 18-21. Referring now to FIG. 18, this Figure illustrates a first level IC structure 200 that is the same as the IC structure 100 shown in FIG. 2, having its reference numerals incremented by 100 to distinguish embodiments. To avoid repetition, and in summary, FIG. 18 illustrates the first level IC structure having carrier 202, insulating layer 204, gate structures 206, source/drain structures 208, nanosheets 210, spacers 212, inner spacers 211, and ILD 214. As noted, and for reference, this structure is described in detail above in connection with FIG. 2.

Figure 19:
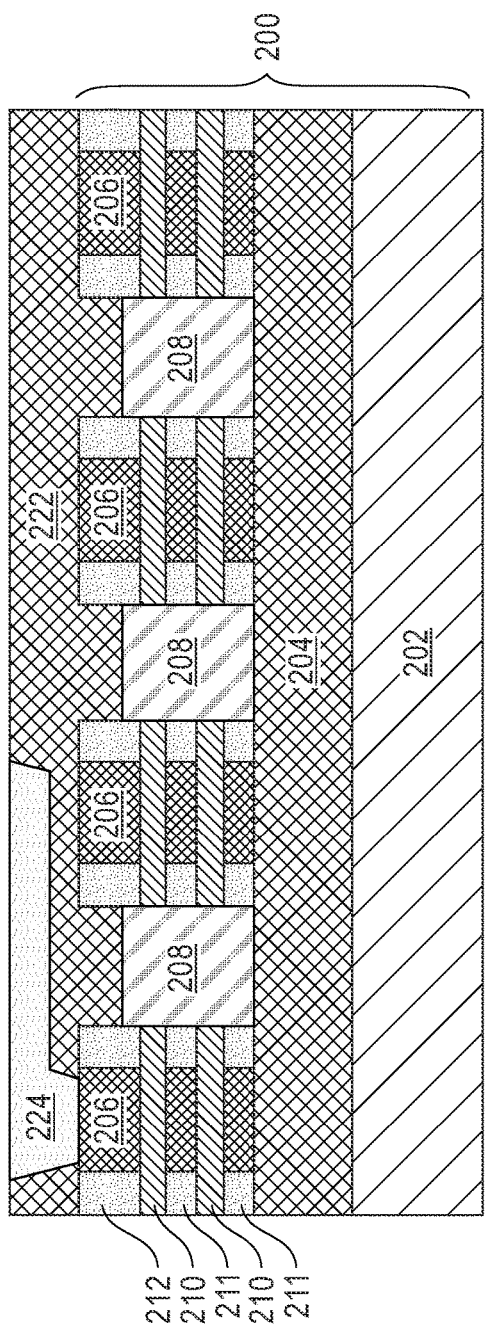

Referring now to FIG. 19, this Figures illustrates the formation of a dummy local interconnect structure 224 substantially as shown and described in greater detail above in connection with FIG. 3, the difference being that dummy local interconnect structure 224, as opposed to structure 124 in FIG. 3, connects to a gate structure 206, as opposed to one of the source/drain structures 208. As in FIG. 2, the dummy local interconnect structure passes laterally through dielectric layer 222.

Figure 20:
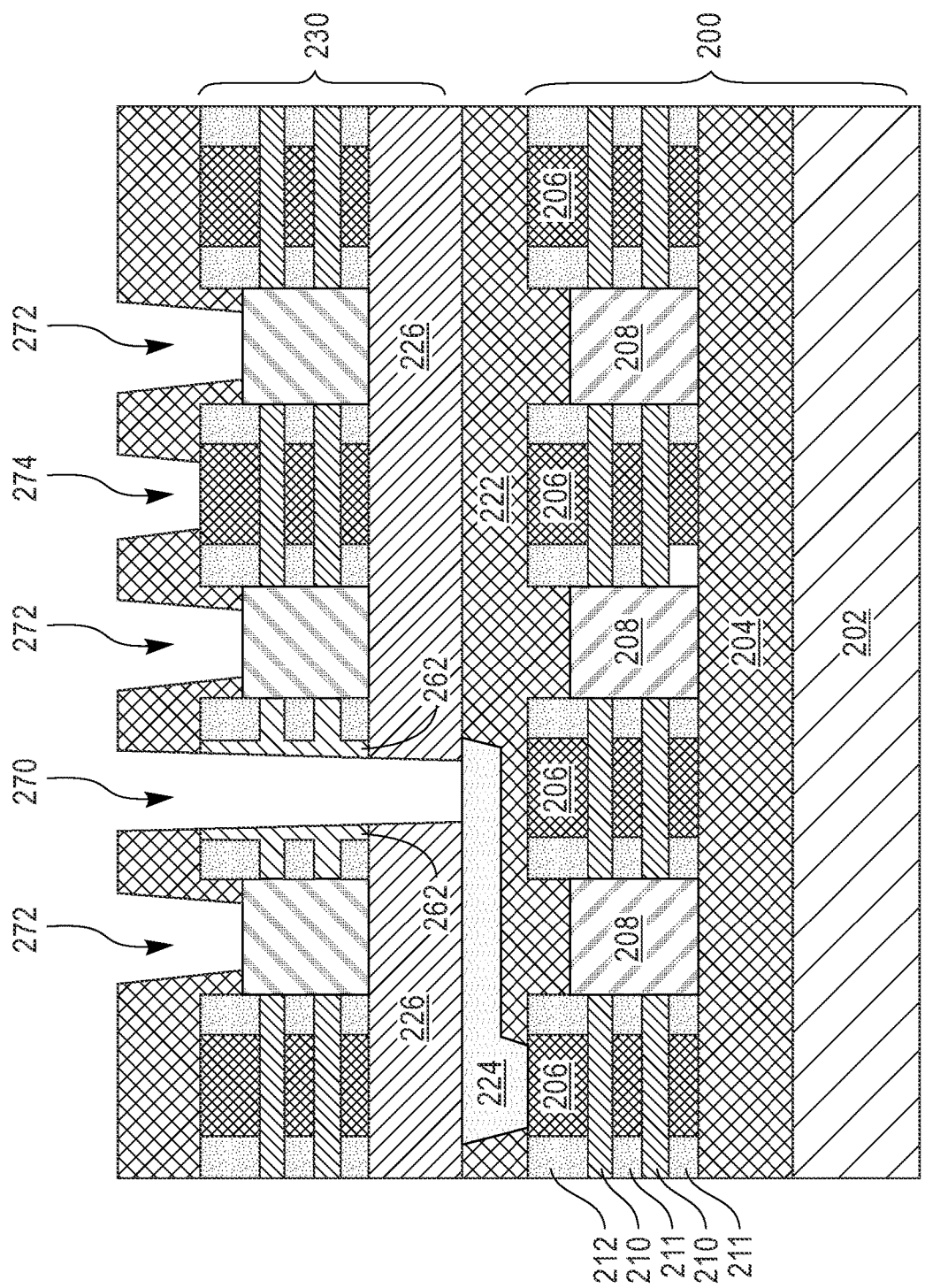

Referring now to FIG. 20, the illustrated structure is accomplished substantially according to the fabrication procedures described above in connection with FIGS. 3-10, wherein the second level IC 230 has been fabricated, and openings 270, 272, and 274 have been formed, whereas, the difference from FIG. 10 being that the opening 270 extends to the dummy local interconnect structure 224 that connects with gate structure 208. Of note, all referenced structures are labeled with numerals incremented by 100 in accordance with FIG. 10.

Figure 21:
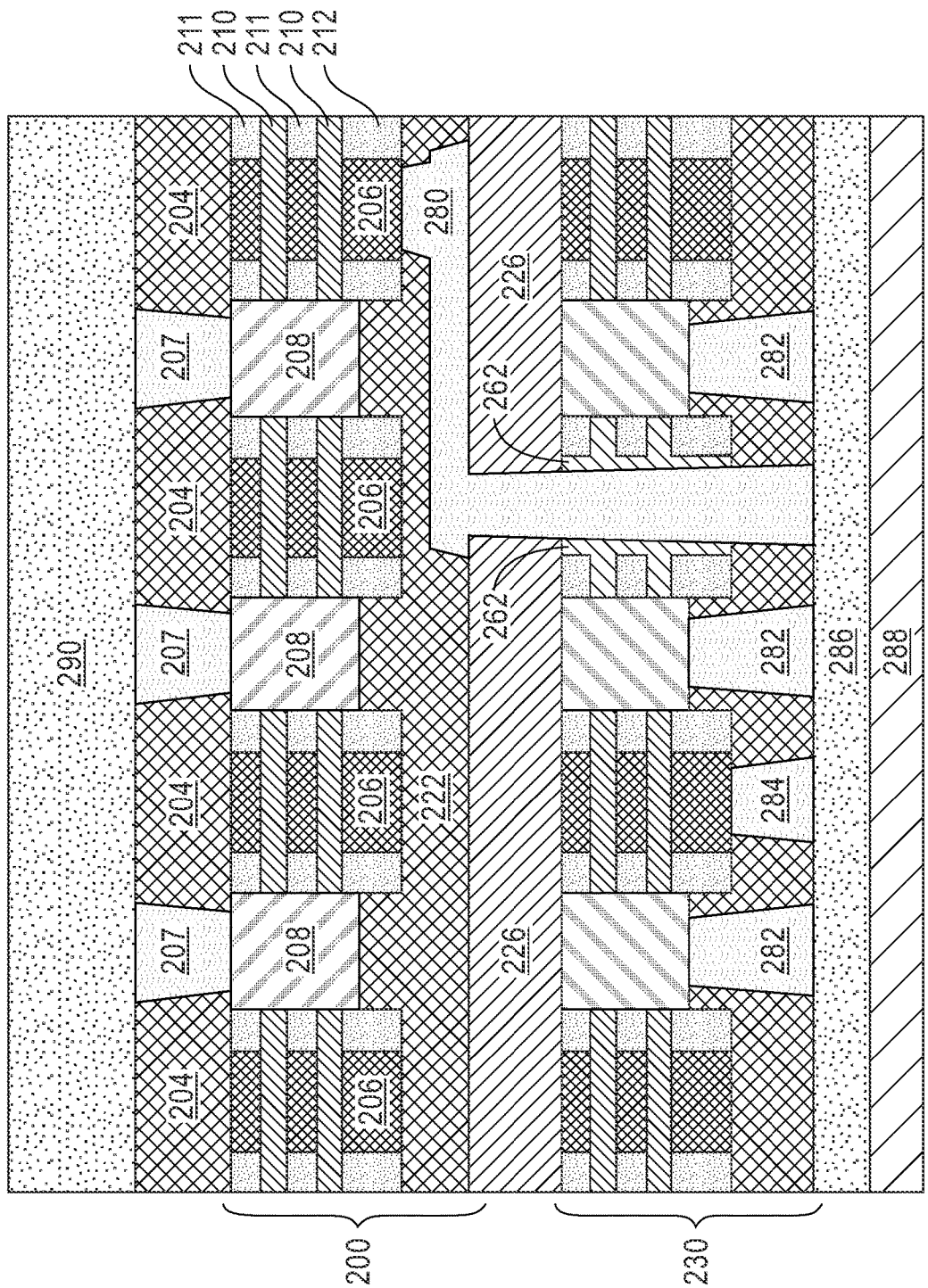

Furthermore, referring now to FIG. 21, the illustrated structure is accomplished substantially according to the fabrication procedures described above in connection with FIGS. 11-17, wherein the local interconnect structure 280 and the contact structures 282, 284 have been formed, in addition to the BEOL layer 286, carrier substrate 288, backside contact 207, and BPR/BSPDN wiring layers 290, thereby illustrating the completed IC structure of the second embodiment.

Figure 22:
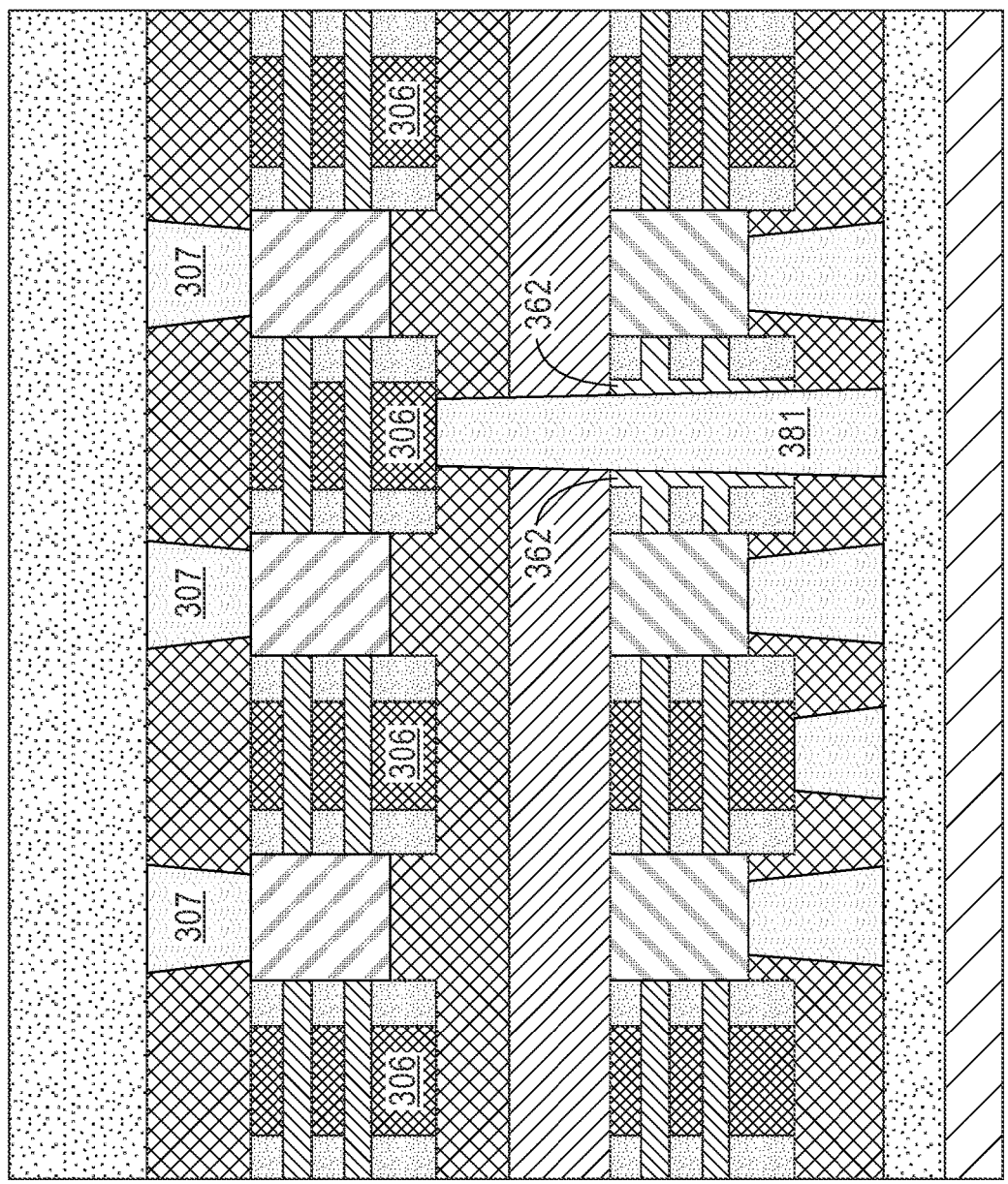
FIG. 22 provides a cross-section view illustrating procedures in the fabrication of a stacked-FET IC device in accordance with a third embodiment of the present disclosure.

The fabrication of a third embodiment of the present disclosure is described in connection with FIG. 22. Referring now to FIG. 22, this Figure illustrates substantially the completed IC structure of the second embodiment shown in FIG. 21, with the difference being that local interconnect structure 381 is provided in place of structure 280, wherein local interconnect structure 381 extends vertically to the gate structure 306 directly overlying the diffusion break region 362, rather than including a lateral component through dielectric layer 222 as illustrated in FIG. 21. To avoid repetition, the processes to arrive at FIG. 22 are not repeated, and it is noted that all referenced structures are labeled with numerals incremented by 100 in accordance with FIG. 21. FIG. 22 therefore illustrates the completed IC structure of the third embodiment.

The fabrication of a fourth embodiment of the present disclosure is described in connection with FIGS. 23-26. Referring now to FIG. 23, this Figure illustrates a first level IC structure 400 that is substantially the same as the second level IC structure 130 shown in FIG. 9, having its reference numerals incremented to the four-hundreds to distinguish embodiments. To avoid repetition, and in summary, FIG. 23 illustrates the first level IC structure having carrier 402, insulating layer 404, gate structures 406, source/drain structures 408, nanosheets 410, spacers 412, inner spacers 411, and ILD 414. Difference from FIG. 9, however, is that the diffusion break dielectric fill region 460 having dielectric fill material 462 is formed in place of a gate 408 in the first level IC 400 as opposed to the second level IC 130 of FIG. 9. Reference is therefore made to the description accompanying FIGS. 6-9 for the processes for the formation of the diffusion break dielectric fill region 460 having dielectric fill material 462.

Referring now to FIG. 24, the processes for forming the dummy local interconnect structure 424 is substantially the same as shown in connection with FIG. 10, describing the etching of the diffusion break dielectric fill region 460, and further in connection with FIG. 3, describing the formation of the dummy local interconnect structure 424 and dielectric layer 422. As such, as shown in FIG. 24, the diffusion break dielectric fill region material 462 has been etched away in the first level IC 400 to allow for the resulting opening to be filled with dummy local interconnect material.

Figure 25:
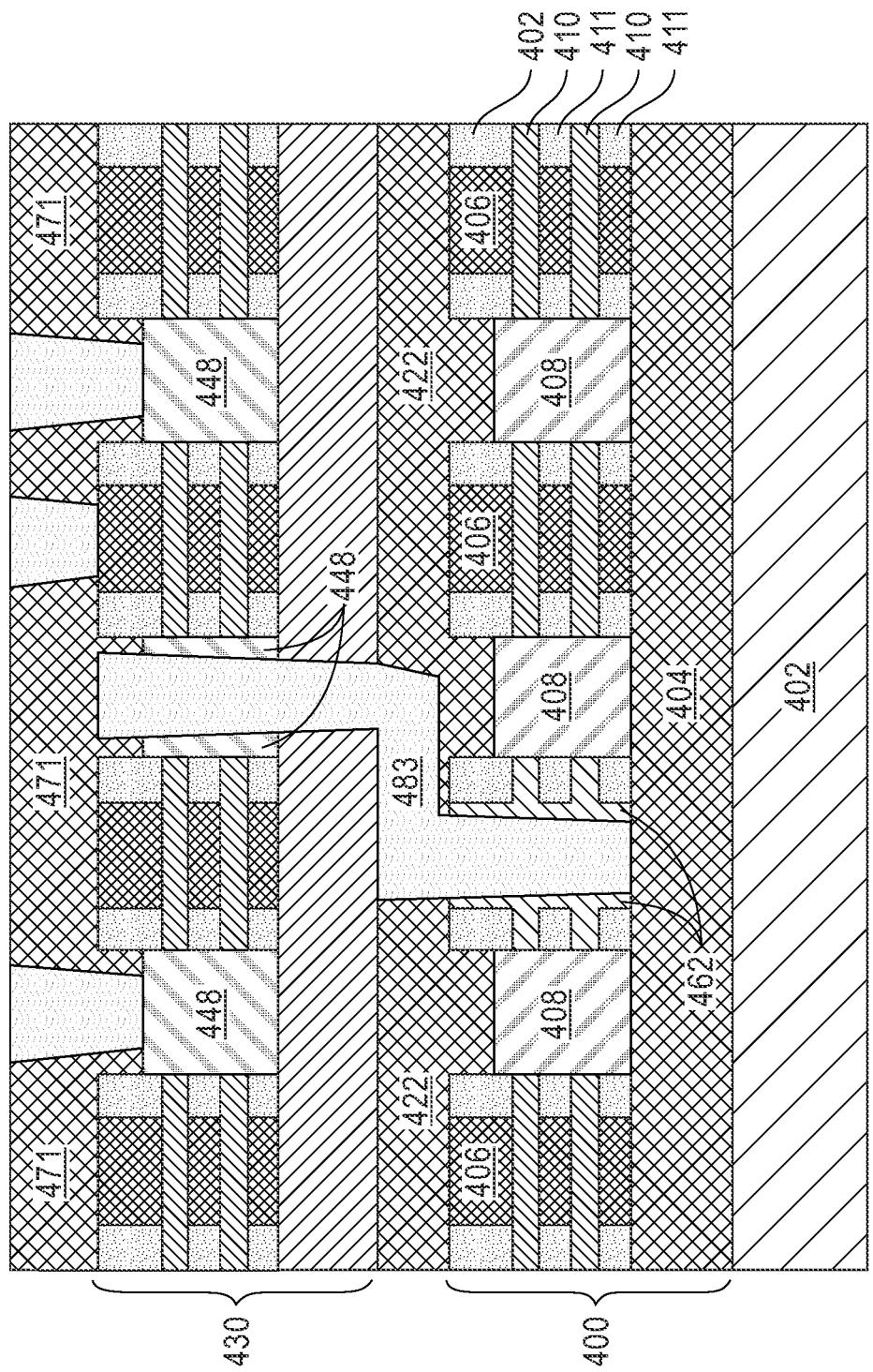

Thereafter, procedures substantially similar to those shown in FIGS. 4, 5, and 10-12, and described above in connection therewith, are employed to arrive at the structure shown in FIG. 25, wherein the first level IC 400 has the local interconnect structure 483 extending through the diffusion break material 462 to the insulating layer 404, and thereafter passing laterally through the dielectric layer 422 to then pass through one of the top source/drain structures 448 of the second level IC 430, terminating at the dielectric layer 471. As such, this embodiment differs from the first three embodiments and illustrates that the diffusion break dielectric fill region 460 (material 462) may be provided as replacing a gate 406 in the first level IC 400 as opposed to the second level IC 430. In this embodiment, as noted, the local interconnect structure 483 passes through a top source/drain structure 448 of the second level IC 430, as opposed simply electrically connecting to it (for example as illustrated in FIG. 12 and described above).

Figure 26:
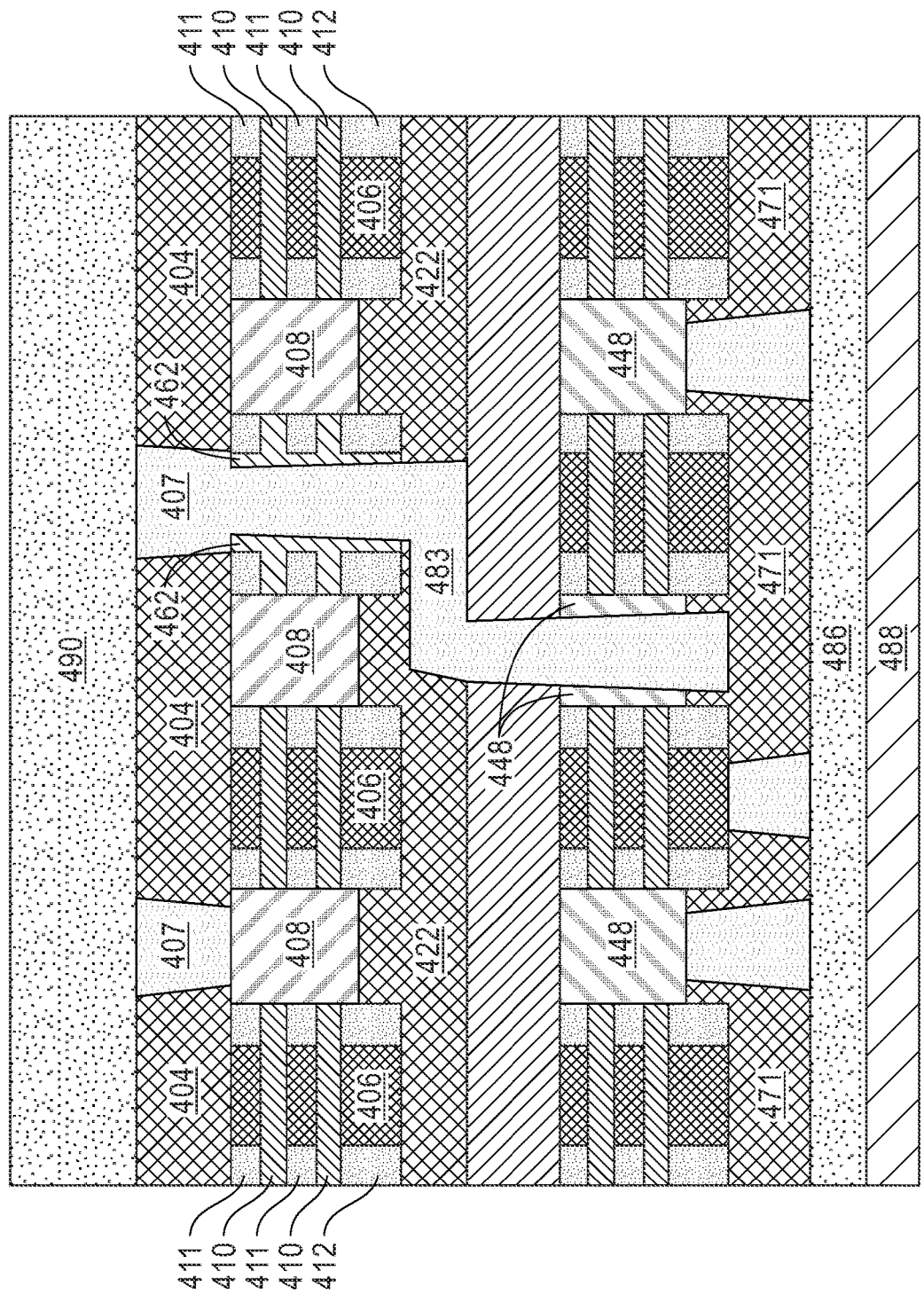

Furthermore, referring now to FIG. 26, the illustrated structure is accomplished substantially according to the fabrication procedures described above in connection with FIGS. 14-17, wherein the backside contact structures 407 have been formed, in addition to the BEOL layer 486, carrier substrate 488, and BPR/BSPDN wiring layers 490, thereby illustrating the completed IC structure of the fourth embodiment.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It should be understood that use of descriptions such as top, bottom, left, right, vertical, horizontal, or the like, are intended to be in reference to the orientation(s) illustrated in the figures, and are intended to be descriptive and to distinguish aspects of depicted features without being limiting. Spatially relative terms, such as "beneath," "below," "lower," "above," "upper," and the like, may be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly. In addition, it will also be understood that when a layer is referred to as being "between" two layers, it can be the only layer between the two layers, or one or more intervening layers may also be present.

It will be understood that, although the terms first, second, etc. may be used herein to describe various elements, these elements should not be limited by these terms. These terms are only used to distinguish one element from another element. Reference to first, second, third, etc., feature is intended to distinguish features without necessarily implying a particular order unless otherwise so stated or indicated. Thus, a first element discussed herein could be termed a second element without departing from the scope of the present concept.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Various aspects of the present disclosure are described by narrative text, flowcharts, block diagrams of computer systems and/or block diagrams of the machine logic included in computer program product (CPP) embodiments. With respect to any flowcharts, depending upon the technology involved, the operations can be performed in a different order than what is shown in a given flowchart. For example, again depending upon the technology involved, two operations shown in successive flowchart blocks may be performed in reverse order, as a single integrated step, concurrently, or in a manner at least partially overlapping in time.

A computer program product embodiment ("CPP embodiment" or "CPP") is a term used in the present disclosure to describe any set of one, or more, storage media (also called "mediums") collectively included in a set of one, or more, storage devices that collectively include machine readable code corresponding to instructions and/or data for performing computer operations specified in a given CPP claim. A "storage device" is any tangible device that can retain and store instructions for use by a computer processor. Without limitation, the computer readable storage medium may be an electronic storage medium, a magnetic storage medium, an optical storage medium, an electromagnetic storage medium, a semiconductor storage medium, a mechanical storage medium, or any suitable combination of the foregoing. Some known types of storage devices that include these mediums include: diskette, hard disk, random access memory (RAM), read-only memory (ROM), erasable programmable read-only memory (EPROM or Flash memory), static random access memory (SRAM), compact disc read-only memory (CD-ROM), digital versatile disk (DVD), memory stick, floppy disk, mechanically encoded device (such as punch cards or pits/lands formed in a major surface of a disc) or any suitable combination of the foregoing. A computer readable storage medium, as that term is used in the present disclosure, is not to be construed as storage in the form of transitory signals per se, such as radio waves or other freely propagating electromagnetic waves, electromagnetic waves propagating through a waveguide, light pulses passing through a fiber optic cable, electrical signals communicated through a wire, and/or other transmission media. As will be understood by those of skill in the art, data is typically moved at some occasional points in time during normal operations of a storage device, such as during access, de-fragmentation or garbage collection, but this does not render the storage device as transitory because the data is not transitory while it is stored.

What is claimed is:

1. A stacked field effect transistor (stacked-FET) device comprising:
   a first layer comprising at least one first layer transistor structure comprising a plurality of first layer terminals;
   a diffusion break dielectric fill region adjacent to one of the first layer terminals;
   a second layer overlying and adjacent to the first layer and comprising at least one second layer transistor structure comprising a plurality of second layer terminals; and
   a contact wiring between the first layer and the second layer passing through the diffusion break dielectric fill region of the first layer and connecting with one of the second layer terminals.

2. The stacked-FET device of claim 1, wherein the plurality of first layer terminals of the at least one first layer transistor structure comprises a first layer gate separating a first layer source region and a first layer drain region.

3. The stacked-FET device of claim 2, wherein the plurality of second layer terminals of the at least one second layer transistor structure comprises a second layer gate separating a second layer source region and a second layer drain region.

4. The stacked-FET device of claim 3, further comprising:
   an interlayer dielectric layer disposed between the first layer and the second layer; and
   wherein the contact wiring comprises a local interconnect structure passing through the interlayer dielectric layer.

5. The stacked-FET device of claim 3, further comprising:
   an oxide layer underlying the first layer; and
   wherein the contact wiring passing through the diffusion break dielectric fill region further connects with the oxide layer.

6. The stacked-FET device of claim 3, further comprising:
   an additional first layer drain region; and
   wherein the diffusion break dielectric fill region is adjacent to the first layer source region and is adjacent to the additional first layer drain region.

7. The stacked-FET device of claim 3, further comprising:
   a backside layer adjacent to the second layer; and
   wherein the contact wiring connects with the second layer gate, and wherein each of the second layer source region and the second layer drain region comprises a backside contact.

8. The stacked-FET device of claim 3, further comprising:
   a backside layer adjacent to the second layer; and
   wherein the contact wiring connects with the second layer source region, and wherein the second layer source region does not have any electrical contact structure formed from the second layer source region to the backside layer.

9. The stacked-FET device of claim 3, further comprising:
   a backside layer adjacent to the second layer; and
   wherein the contact wiring connects with the second layer drain region, and wherein the second layer drain region lacks any backside contact.

10. A stacked field effect transistor (stacked-FET) device comprising:
    a first layer comprising at least one first layer transistor structure comprising a plurality of first layer terminals;
    a second layer overlying and adjacent to the first layer and comprising at least one second layer transistor structure comprising a plurality of second layer terminals;
    a diffusion break dielectric fill region adjacent to one of the second layer terminals; and
    a contact wiring between the first layer and the second layer passing through the diffusion break dielectric fill region of the second layer and passing through one of the first layer terminals.

11. The stacked-FET device of claim 10, wherein the plurality of first layer terminals of the at least one first layer transistor structure comprise a first layer gate separating a first layer source region and a first layer drain region.

12. The stacked-FET device of claim 11, wherein the plurality of second layer terminals of the at least one second layer transistor structure comprise a second layer gate separating a second layer source region and a second layer drain region.

13. The stacked-FET device of claim 12, further comprising:
    a middle-of-line layer adjacent to the first layer source region and the first layer drain region; and
    wherein the contact wiring connects with the middle-of-line layer.

14. The stacked-FET device of claim 12, further comprising:
    a buried oxide layer overlying and adjacent to the second layer;
    a backside layer adjacent to the second layer; and
    wherein the contact wiring passes through the buried oxide layer to connect with the backside layer.

15. The stacked-FET device of claim 12, further comprising:
    an additional second layer drain region; and
    wherein the diffusion break dielectric fill region is adjacent to the second layer source region and is adjacent to the additional second layer drain region.

16. The stacked-FET device of claim 12, further comprising:
    an interlayer dielectric layer disposed between the first layer and the second layer; and
    wherein the contact wiring comprises a local interconnect structure passing through the interlayer dielectric layer.

17. The stacked-FET device of claim 12, wherein the contact wiring passes through the first layer source region.

18. The stacked-FET device of claim 12, wherein the contact wiring passes through the first layer drain region.

19. A stacked field effect transistor (stacked-FET) device comprising:
    a first layer comprising at least one first layer transistor structure comprising a plurality of first layer terminals;
    a diffusion break dielectric fill region adjacent to one of the first layer terminals;
    a second layer overlying and adjacent to the first layer and comprising at least one second layer transistor structure comprising a plurality of second layer terminals;
    a contact wiring between the first layer and the second layer passing through the diffusion break dielectric fill region of the first layer and connecting with one of the second layer terminals; and an additional first layer drain region;
wherein the diffusion break dielectric fill region is adjacent to the first layer source region and is adjacent to the additional first layer drain region.

20. The stacked-FET device of claim 19, further comprising:
a backside layer adjacent to the second layer; and
wherein the contact wiring connects with the second layer gate, and wherein each of the second layer source region and the second layer drain region comprises a backside contact.

* * * * *